(12) United States Patent
Kwak et al.

(10) Patent No.: US 7,842,571 B2
(45) Date of Patent: Nov. 30, 2010

(54) METHOD FOR FORMING SEMICONDUCTOR DEVICE

(75) Inventors: Dong-Hwa Kwak, Gyeonggi-do (KR); Jae-Kwan Park, Gyeonggi-do (KR); Jae-Hwang Sim, Seoul (KR); Jin-Ho Kim, Gyeonggi-do (KR); Ki-Nam Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 930 days.

(21) Appl. No.: 11/623,269

(22) Filed: Jan. 15, 2007

(65) Prior Publication Data

US 2008/0096377 A1    Apr. 24, 2008

(30) Foreign Application Priority Data

Oct. 19, 2006    (KR) ...................... 10-2006-0101957

(51) Int. Cl.
    *H01L 21/336* (2006.01)
(52) U.S. Cl. ................ 438/258; 438/675; 257/E21.585
(58) Field of Classification Search ................. 438/258, 438/675
    See application file for complete search history.

(56) References Cited

U.S. PATENT DOCUMENTS 6,153,513 A * 11/2000 Lee et al. .................... 438/639
6,528,418 B1 * 3/2003 Kim et al. ................... 438/672
2003/0022484 A1 * 1/2003 Lee ............................ 438/637

FOREIGN PATENT DOCUMENTS

| JP | 2003-17590 | 1/2003 |
|---|---|---|
| KR | 1998-083674 | 12/1998 |
| KR | 10-2000-0042845 | 7/2000 |
| KR | 2000-0044952 | 7/2000 |
| KR | 10-2000-0074199 | 12/2000 |
| KR | 10-2005-0002005 | 1/2005 |

OTHER PUBLICATIONS

English language abstract of Korean Publication No. 1998-083674.
English language abstract of Korean Publication No. 10-2000-0042845.
English language abstract of Korean Publication No. 10-2000-0074199.

* cited by examiner

*Primary Examiner*—Chandra Chaudhari
(74) *Attorney, Agent, or Firm*—Myers Bigel Sibley & Sajovec, PA

(57) ABSTRACT

In one embodiment a semiconductor device includes odd contacts and respective odd lines. Spacers are formed on sidewalls of the odd lines and even openings for even lines are formed by performing an etching process. Even contacts are formed in the even openings and then even lines are formed.

14 Claims, 33 Drawing Sheets

METHOD FOR FORMING SEMICONDUCTOR DEVICE

CROSS-REFERENCE TO RELATED APPLICATIONS

This patent application claims the benefit of foreign priority to Korean Patent Application No. 2006-0101957 filed on Oct. 19, 2006, the entire contents of which are hereby incorporated by reference.

BACKGROUND

Exemplary embodiments disclosed herein generally relate to formation of lines and, more particularly, to formation of bit lines in a semiconductor device. Exemplary embodiments disclosed herein also relate to bit lines in a semiconductor device such as a non-volatile memory device and a method for forming the same.

As semiconductor devices become increasingly integrated, the widths of patterns and the intervals between adjacent patterns decrease. Conventionally, fine patterns are formed by performing various photolithography processes. However, as the degree to which semiconductor devices are integrated increases, a misalignment margin in such photolithography processes decreases. Accordingly, fine patterns (e.g., contacts) are often misaligned with respect to underlying conductive regions during photolithography processes. For example, when even a slight degree of a misalignment occurs during a photolithography process for forming a bit line, misalignment between bit lines and bit line contacts occurs, thereby bridging one bit line to an adjacent bit line. Moreover, due to the reduction of a photolithography process margin, adjacent bit lines can become electrically connected to each other.

SUMMARY

Exemplary embodiments described herein provide a conductive line structure and a method for forming the same. Exemplary embodiments described herein also provide a non-volatile memory device including a bit line and a method for forming the same. Exemplary embodiments described herein also provide a memory card including the non-volatile memory device. Exemplary embodiments described herein also provide a stacked memory device including a non-volatile memory device.

One embodiment exemplarily described herein can be characterized as a method for forming a conductive line that includes forming an insulation layer on a substrate, the substrate including a plurality of first regions and a plurality of second regions, each of the second region being disposed between adjacent first regions; forming a plurality of first conductive lines on the insulation layer, the first conductive lines being electrically connected to respective first regions through respective first contacts through the insulation layer; forming a plurality of spacers on sidewalls of the first lines; forming a plurality of contact holes between the adjacent first contacts by removing the insulation layer between the adjacent ones of the plurality of spacers, the contact holes exposing respective second regions; and forming a plurality of second contacts filling respective contact holes and forming a plurality of second conducive lines electrically connected to respective second contacts.

Another embodiment exemplarily described herein can be characterized as a method of forming a non-volatile memory device that includes forming a string select line, a ground select line, and a plurality of word lines between the string select line and the ground select line on a substrate having a plurality of active regions, the string and ground select lines and the plurality of word lines crossing over the active regions; forming an insulation layer covering the ground select line, the string select line, and the plurality of word lines; patterning the insulation layer to form a plurality of first contact holes; forming a plurality of first contacts within respective first contact holes and forming a plurality of first bit lines electrically connected to respective first contacts; forming a plurality of spacers on sidewalls of the first bit lines; forming a second contact hole between adjacent ones of the plurality of first contact holes by removing the insulation layer between the adjacent ones of the plurality of spacers; and forming a second contact within the second contact holes and a second bit line electrically connected to the second contact.

Still another embodiment exemplarily described herein can be characterized as a stacked memory device that includes a plurality of substrates having at least two stacked substrates; and a memory device disposed on at least one of the substrates. In such an embodiment, the memory device can be formed according to the method disclosed in the immediately preceding paragraph.

Still another embodiment exemplarily described herein can be characterized as a memory card that includes a microprocessor; and a memory device coupled to the microprocessor. In such an embodiment, the memory device can be formed according to the method disclosed in the immediately preceding paragraph.

Yet another embodiment exemplarily described herein can be characterized as a semiconductor device that includes a plurality of first bit lines and a plurality of first contacts connected to respective first bit lines; a spacer formed on a sidewall of each of the first bit lines; and a second bit line self-alignedly disposed between the adjacent spacers and a second contact self-aligned with and connected to the second bit line.

A further embodiment exemplarily described herein can be characterized as a non-volatile memory device that includes a substrate including a plurality of active regions defined by a device isolation region; a string select line, a ground select line, and a plurality of word lines disposed between the string select line and the ground select line, the string and ground select lines and the plurality of word lines crossing over the active regions; an insulation layer covering the string select line, the ground select line, the plurality of word liens, and the active regions; first contacts through the insulation layer and electrically connected to odd active regions; first bit lines electrically connected to respective first contacts; a spacer formed on a sidewall of the first bit lines; and a second bit line self-alignedly disposed between the adjacent spacers and a second contact self-aligned with and connected to the second bit line.

Yet another embodiment exemplarily described herein can be characterized as a method of forming a semiconductor device that includes forming a first insulation layer on a substrate; forming a first mask on the first insulation layer, the first mask defining an opening; forming a first groove within the first insulation layer using the first mask; forming a second insulation layer on the first mask and on a side of the first groove to define a second groove, the second groove having a smaller width than the first groove; forming a second mask filling the second groove; forming a plurality of third grooves for bit lines by removing the second insulation layer, each third groove being between the first and second masks; forming a third mask having an opening exposing the third grooves; forming a plurality of contact holes disposed between the adjacent first and second masks and self-aligned with respect to the third grooves by patterning the first insulating layer using the third, second and first masks as an etching mask; forming a conductive material on the first and second masks to fill the third grooves and respective contact holes; and forming a plurality of conductive lines and a plurality of contacts by performing an etching process on the conductive material, the contacts being self-aligned with respective conductive lines.

Still another embodiment exemplarily described herein can be characterized as a method of forming a line that includes forming a first insulation layer on a substrate; forming a first mask on the first insulation layer, the first mask defining a first groove therein; forming a second mask dividing the first groove, the second mask disposed within the first groove and defining a plurality of third grooves between the first and second masks; forming a third mask, the third mask having an opening crossing over at least one of the plurality of third grooves; forming a plurality of contact holes self-aligned with third grooves by patterning the first insulation layer using the third mask, the second mask, and the first mask as an etching mask; and defining a plurality of conductive lines and a plurality of contacts self-aligned with respect to corresponding conductive lines by filling the contact holes and the third grooves with a conductive material and etching the conductive material.

Another embodiment exemplarily described herein can be characterized as a method for forming a semiconductor device that includes forming a first insulation layer on a substrate; forming a plurality of first contacts through the first insulation layer; forming a second contact through the first insulation layer between adjacent ones of the plurality of first contacts; forming an insulation structure on the first insulation layer, the insulation structure defining a groove, wherein at least a portion of the first insulation layer defines a lower surface of the groove; forming a plurality of first conductive lines on the first insulation layer, the plurality of first conductive lines electrically connected to corresponding ones of the plurality of first contacts; and forming a second conductive line within the groove, the second conductive line electrically connected to the second contact, wherein the insulation structure is formed on sidewalls of adjacent ones of the plurality of first conductive lines.

Yet another embodiment exemplarily described herein can be characterized as a semiconductor device that includes a first insulation layer on a substrate; a plurality of first contacts through the first insulation layer; a second contact through the first insulation layer and between adjacent ones of the plurality of contacts; an insulation structure on the first insulation layer, the insulation structure defining a groove, wherein at least a portion of the first insulation layer defines a lower surface of the groove; a plurality of first conductive lines on the first insulation layer, the plurality of first conductive lines electrically connected to corresponding ones of the plurality of first contacts; and a second conductive line within the groove, the second conductive line electrically connected to the second contact, wherein the insulation structure is formed on sidewalls of adjacent ones of the plurality of first conductive lines.

Lastly, another embodiment exemplarily described herein can be characterized as a method of forming a semiconductor device that includes forming a first insulation layer on a substrate; forming a plurality of first bit lines on the first insulation layer; forming an insulation structure on the first insulation layer; and forming a second bit line on the first insulation layer between the plurality of first bit lines, wherein the second bit line is self-aligned with respect to the insulation structure.

BRIEF DESCRIPTION OF THE FIGURES

The accompanying figures are included to provide a further understanding of the exemplary embodiments, and are incorporated in and constitute a part of this specification. The drawings illustrate exemplary embodiments of the present invention and, together with the description, serve to exemplarily explain principles of the present invention. In the figures.

DETAILED DESCRIPTION

Exemplary embodiments will be described below in more detail with reference to the accompanying drawings. These embodiments may, however, be realized in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

A 'semiconductor substrate' or a 'substrate' mentioned in the exemplary embodiments may refer to a structure based on an arbitrary semiconductor. The structure based on the semiconductor may include a silicon-on-insulator (SOI) having silicon on an insulation layer, silicon-on-sapphire (SOS) having silicon on sapphire, silicon-germanium, doped or undoped silicon, an epitaxial layer formed by an epitaxial growth technology, and another semiconductor structure. Additionally, a 'semiconductor substrate' or a 'substrate' may be a semiconductor substrate or a substrate where an arbitrary semiconductor device, e.g., a memory device, is already formed.

The terms 'odd bit line' and 'even bit line', as used herein below, are relative. When one bit line is called an 'odd bit line', a bit line adjacent to the one bit line is called an 'even bit line'. Conversely, when one bit line is called an 'even bit line', a bit line adjacent to the one bit line is called an 'odd bit line'. For example, when considering adjacent two bit lines, when one bit line is an 'odd bit line', the other one is an 'even bit line', and vice versa.

Exemplary embodiments described herein relate to a method of forming lines and the line structure resulting therefrom. The exemplary embodiments also relate to formation of bit lines in a semiconductor device such as a memory device. The exemplary embodiments may also relate to bit lines of a non-volatile memory device and to a method for forming the same. Hereinafter, various types of lines will be exemplary described. Moreover, a bit line of a non-volatile memory device will be described as an example.

Figure 1:
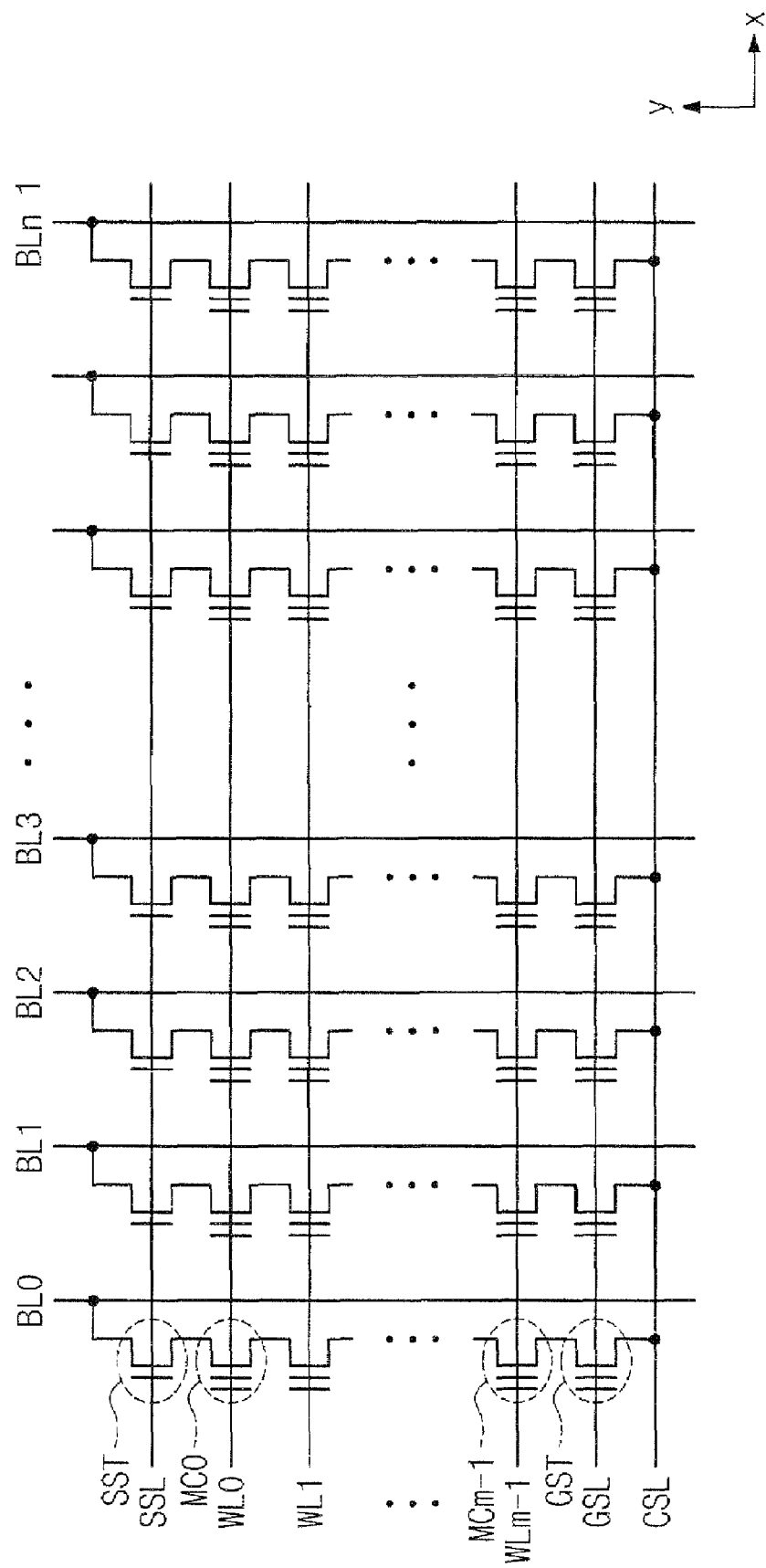
FIG. 1 is an equivalent circuit diagram of one embodiment of a non-volatile memory device.

FIG. 1 is an equivalent circuit diagram of one embodiment of a non-volatile memory device such as a NAND flash memory device.

Referring to FIG. 1, a string select line SSL and a ground select line GSL are disposed in a row direction (e.g., an x-axis direction), and word lines WL0 to WLm-1 are disposed between the string select line SSL and the ground select line GSL. Bit lines BL0 to BLn-1 are disposed in a column direction (e.g., a y-axis direction) to cross over the word lines WL0 to WLm-1.

A plurality of memory cells are coupled to each of the word lines WL0 to WLm-1 such that a plurality of memory cells MC0 to MCm-1 arranged in the column direction are connected in series to form a unit NAND string. A string select transistor SST and a ground select transistor GST are disposed on both sides of each unit NAND string. Gates of the string select transistors SST arranged in a row direction are connected to each other to form the string select line SSL and gates of the ground select transistors GST arranged in a row direction are connected to each other to form a ground select line GSL. A bit line is connected to respective string select transistor SST (e.g., via a drain region) of each NAND string. Source regions of the ground select transistors GST are connected to a common source line CSL.

Figure 2:
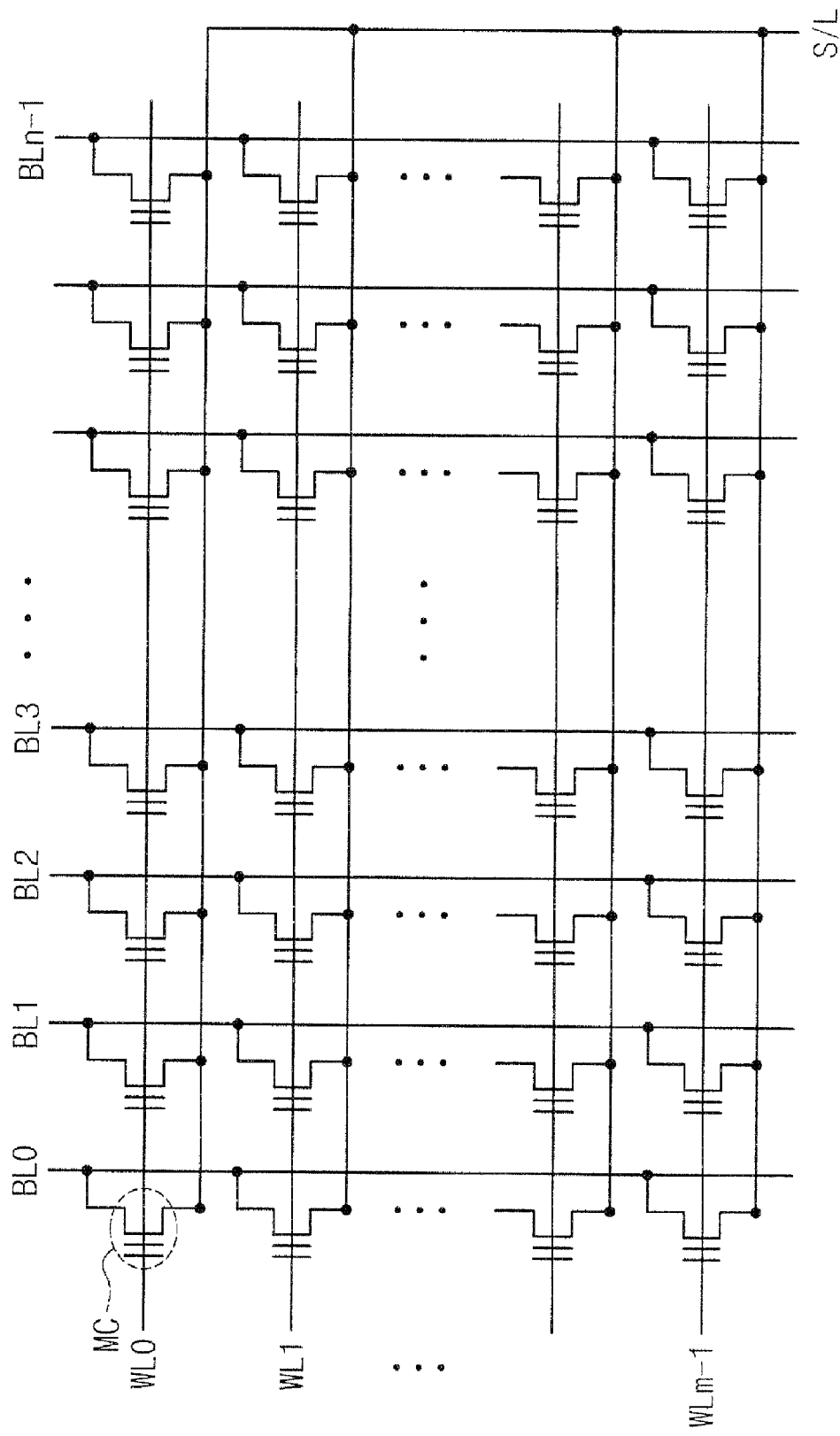
FIG. 2 is an equivalent circuit diagram of another embodiment of a non-volatile memory device.

FIG. 2 is an equivalent circuit diagram of one embodiment of a non-volatile memory device such as a NOR flash memory device.

Referring to FIG. 2, and unlike the NAND flash memory device of FIG. 1, a bit line BL and a source line S/L are connected to each memory cell. That is, the memory cells arranged in a column direction are separated from each other.

The types and forms of memory cells that may be combined in a word line may be numerous. For example, memory cells can include a tunneling insulation layer, a memory layer (or a charge storage layer), and a control insulation layer (or an inter-gate dielectric layer) which are sequentially stacked on a semiconductor substrate. The memory layer may include a material capable of storing electric charges that are injected from the substrate through the tunneling insulation layer. For example, a memory layer can include an insulator material capable of trapping electric charges with a high trap density. Such an insulator material can include, for example, nitride, aluminum oxide ($Al_2O_3$), hafnium oxide (HfO), hafnium aluminum oxide (HfAlO), hafnium silicon oxide (HfSiO) or combinations thereof. Additionally, polysilicon nano-particles, metal nano-particles, fullerenes, or the like, can be used as, or incorporated within, a memory layer. A floating gate such as polysilicon also can be used as a memory layer.

In the NAND flash memory device of FIG. 1, drain regions of the string select transistors SST arranged in a column direction are connected to the respective lines BL0 to BLn-1. In the NOR flash memory device of FIG. 2, the bit lines BL0 to BLn-1 are connected to each memory cell. Accordingly, to form a reliable highly-integrated flash memory device, the bit line is connected to the corresponding string select transistor SST in the NAND flash memory device, and is connected to the respective memory cell MC in the NOR flash memory device.

According to the embodiments described herein, the bit line of the NAND flash memory device is connected to a drain region of a string select transistor SST through a bit line contact and the bit line of a NOR flash memory device is connected to a source/drain region of the memory cell. In one embodiment, bit lines may be provided as either a first bit line or a second bit line, wherein second bit lines can be disposed between adjacent first bit lines. Accordingly, odd bit lines may be referred to as first bit lines and even bit lines may be referred to as second bit lines. Each bit line is electrically connected to a respective bit line contact. In one embodiment, the first bit line and the second bit line can have different structures and, therefore, can be formed according to different methods. The bit lines will be described with reference to FIGS. 3 through 5.

Figure 3:
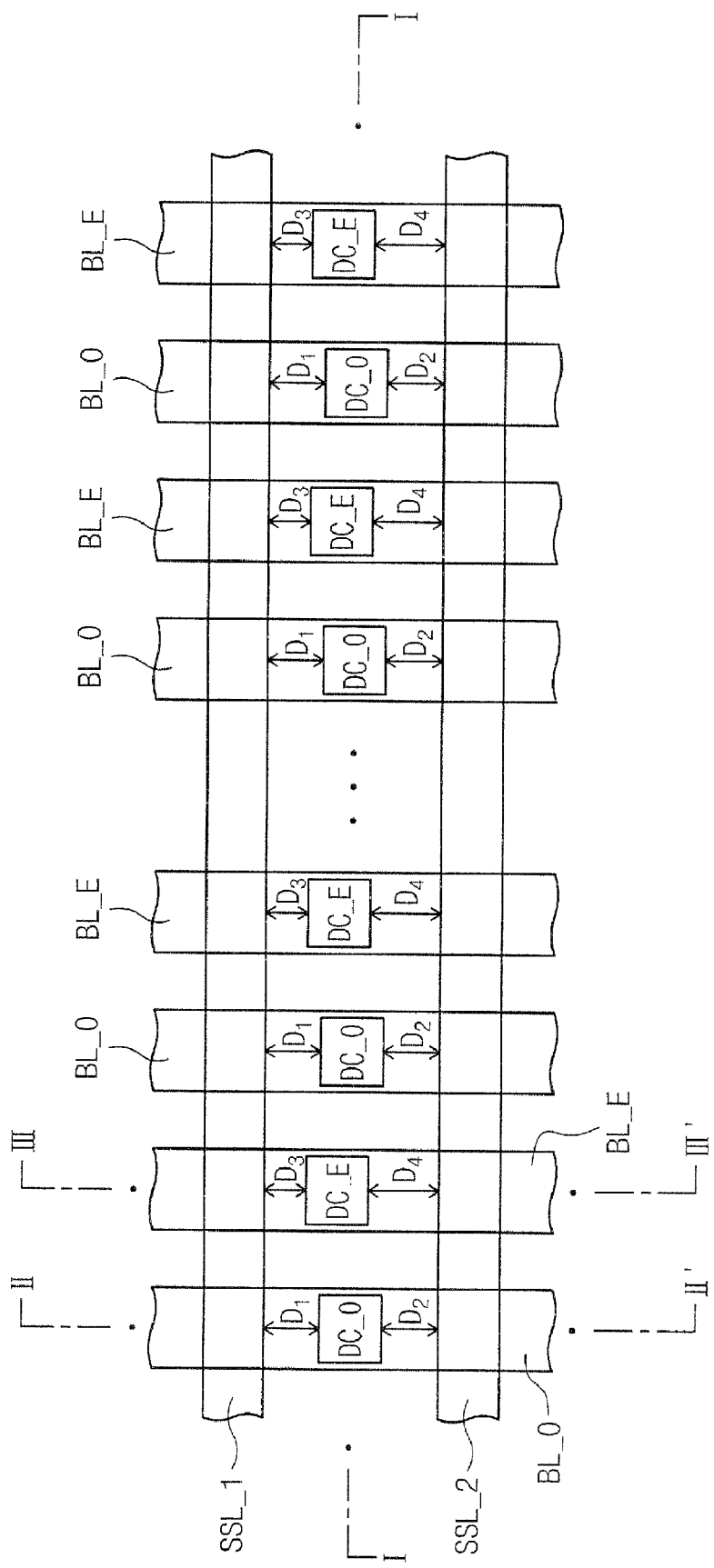
FIG. 3 is a plan view exemplarily illustrating connections between bit lines and corresponding bit line contacts in a non-volatile memory device according to one embodiment.

FIG. 3 is a plan view showing connections to odd bit lines BL_O and even bit lines BL_E and respective odd bit line contacts DC_O and even bit line contacts DC_E in a NAND flash memory device, according to one embodiment.

Referring to FIG. 3, the odd bit lines BL_O are connected to the respective odd bit line contacts DC_O, and the even bit lines BL_E are connected to the respective even bit line contacts DC_E. In one embodiment, the even bit lines BL_E and the odd bit lines BL_O may have the same structure or may have different structures. The even bit lines BL_E and the odd bit lines BL_O may be structurally different when, for example, the even bit lines BL_E and odd bit lines BL_O are formed according to different methods. For example, the odd bit lines BL_O can be formed using a photolithography process while the even bit lines BL_E can be formed between the odd bit lines BL_O in a self-aligned manner. Moreover, the even bit line contact DC_E can be formed on the respective even bit lines BL_E in a self-aligned manner.

Because the even bit line contacts DC_E and corresponding even bit lines BL_E can be formed in a self-aligned manner, an overlapping area between the odd bit lines BL_O and the respective odd bit line contacts DC_O can, in one embodiment, be less than or substantially equal to an overlapping area between the even bit line BL_E and the respective odd bit line contact DC_E. In one embodiment, a distance between the odd bit line contact DC_O and a string select line SSL (or a string select gate) may be different from or substantially equal to a distance between the even bit line contact DC_E and the string select line (or a string select gate).

Referring to FIG. 3, a distance D1 between an odd bit line contact DC_O and a first string select line SSL_1 (or a first string select gate) may be greater than a distance D3 between the even bit line contact DC_E and the first string select line SSL_1 (or the first string select gate). A distance D2 between the odd bit line contact DC_O and a second string select line SSL_2 (or a second string select gate) may be shorter than a distance D4 between the even bit line contact DC_E and the second string select line SSL_2 (or the second string select gate). As described above, the structural difference may be result from that the odd bit line and the even bit line are formed by different methods.

Figure 4:
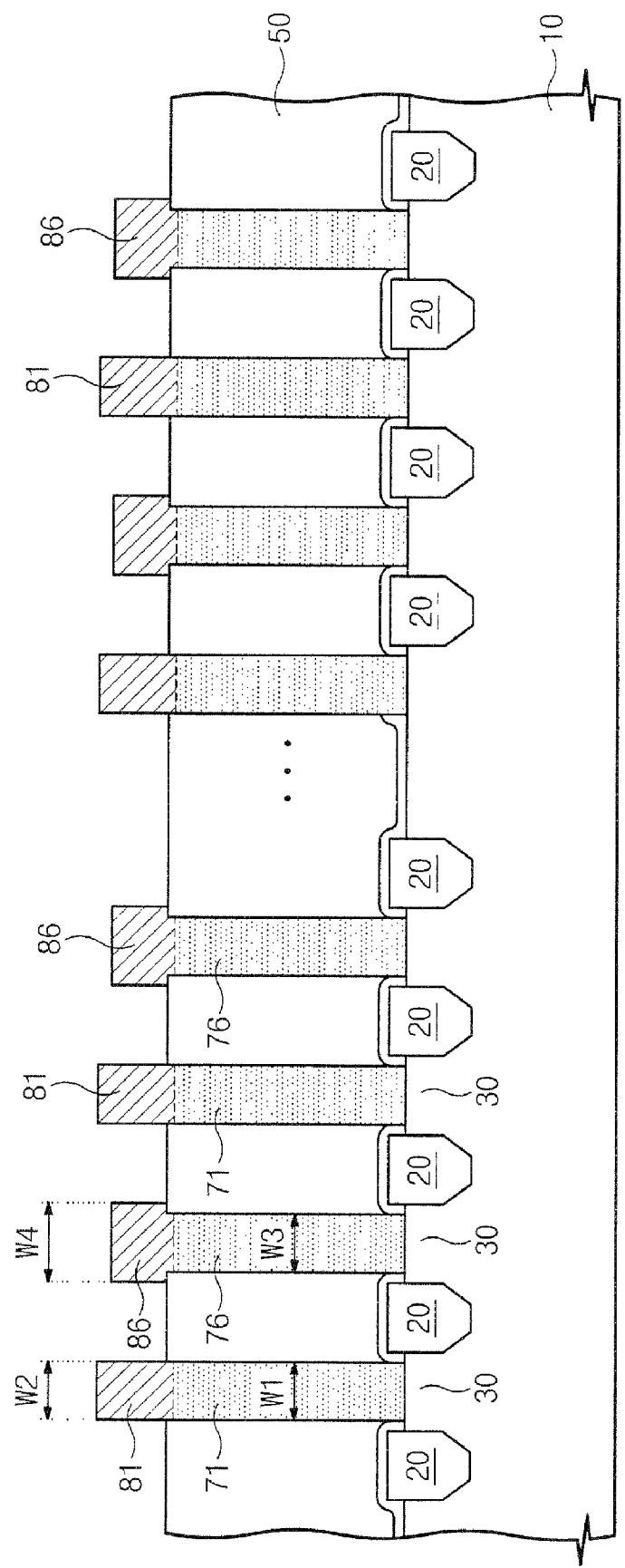
FIG. 4 is a cross-sectional view of the non-volatile memory device shown in FIG. 3, taken along line I-I' thereof.

FIG. 4 is a cross-sectional view of the non-volatile memory device shown in FIG. 3, taken along line I-I'.

Referring to FIG. 4, an active region 30 may be defined in a substrate 10 by a device isolation region 20. Adjacent active regions 30 may be electrically insulated from each other by a device isolation region 20. A bit line is electrically connected to the respective active region 20 through a bit line contact. For example, bit line contacts 71 and 76 are formed through an insulation layer 50 to electrically contact the active regions. In one embodiment, an odd bit line and an even bit line can have the same or different structures (e.g., different widths, different heights, or different widths and heights). For example, the height of the even bit line 86 may be less than the height of the odd bit line 81. Moreover, the width $w_1$ of the odd bit line contact 71 and the width $w_2$ of the odd bit line 81 can be substantially the same. Further, the width $w_3$ of the even bit line contact 76 may be less than the width $w_4$ of the even bit line 86 and the width $w_2$ of the odd bit line contact 81 may be less than the width $w_4$ of the even bit line 86. The even bit line contact 76 is self-aligned with respect to a respective even bit line 86. However, when the odd bit line 81 is formed by a photolithography process, the odd bit line 81 may be misaligned with respect to a respective odd bit line contact 71 within an acceptable range.

Figure 5:
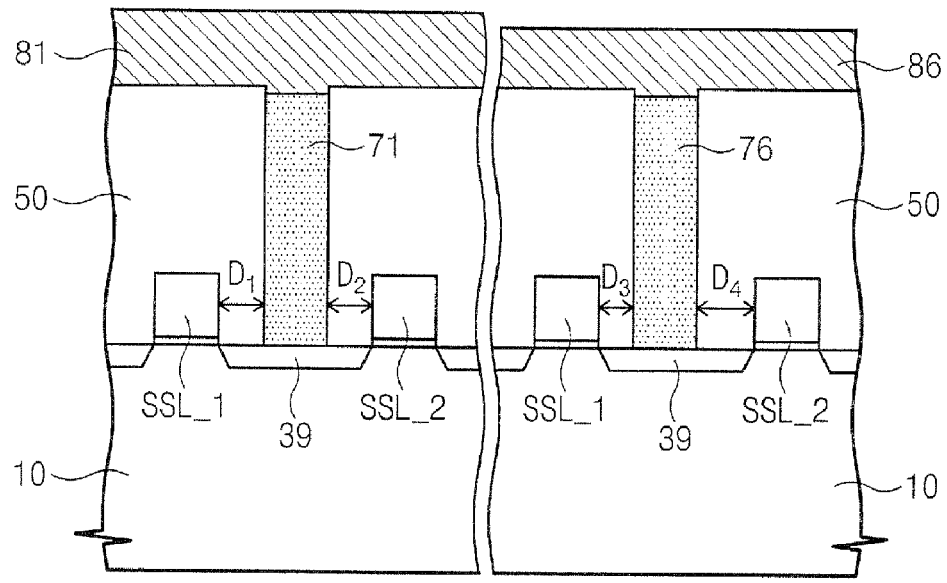
FIG. 5 is a cross-sectional view of the non-volatile memory device shown in FIG. 3, taken along lines II-II' and III-III' thereof.

FIG. 5 is a cross-sectional view of the non-volatile memory device shown in FIG. 3, taken along lines II-II' and III-III'. Specifically, a left-illustrated portion of FIG. 5 is a cross-sectional view of the non-volatile memory device shown in FIG. 3, taken along line II-II' and shows a cross-sectional view of odd bit lines while a left-illustrated portion of FIG. 5 is a cross-sectional view of the non-volatile memory device shown in FIG. 3, taken along line III-III' and shows a cross-sectional view of even bit lines.

Referring generally to FIG. 5, each bit line 81 and 86 is electrically connected to an active region outside a string select line (or a string select gate), i.e., a drain region 39. Specifically, the bit lines 81 and 86 are electrically connected to the drain region 39 between the first string select line SSL_1 and the second string select line SSL_2 via bit line contacts 71 and 76, respectively.

Figure 6:
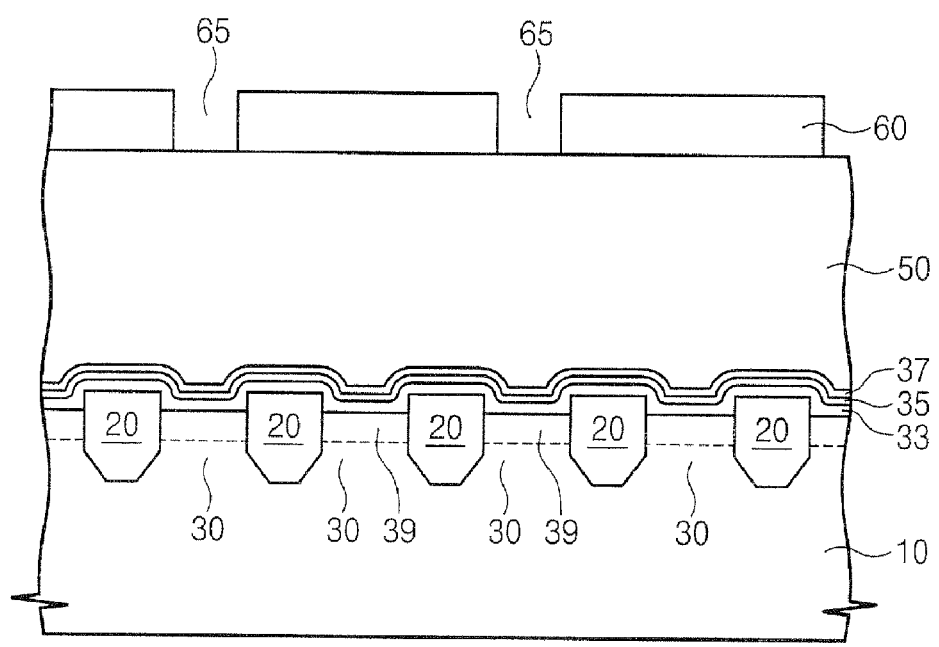
FIGS. 6-14 are cross-sectional views illustrating an exemplary embodiment of a method for forming a non-volatile memory device.
Figure 7:
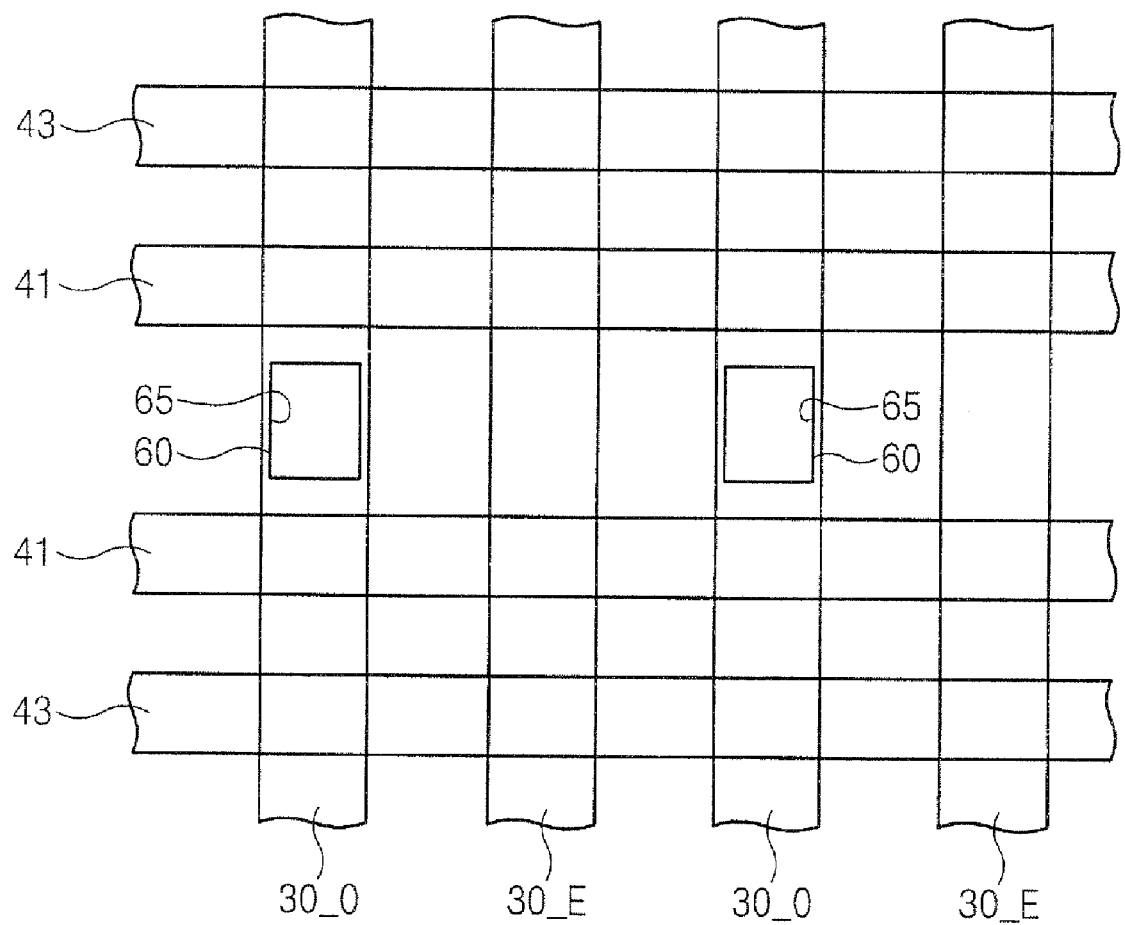
Figure 9:
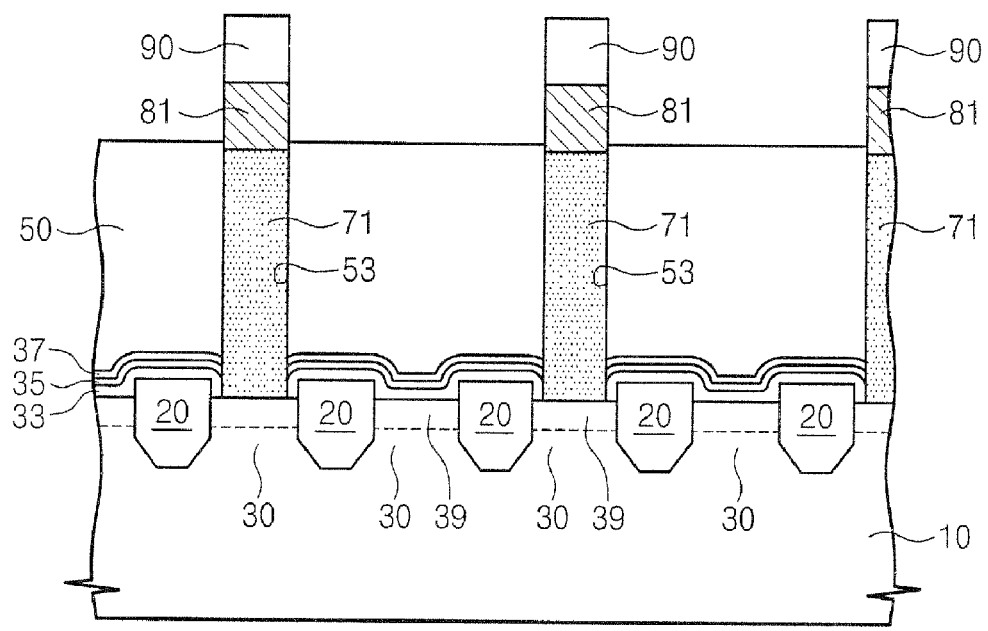
Figure 10:
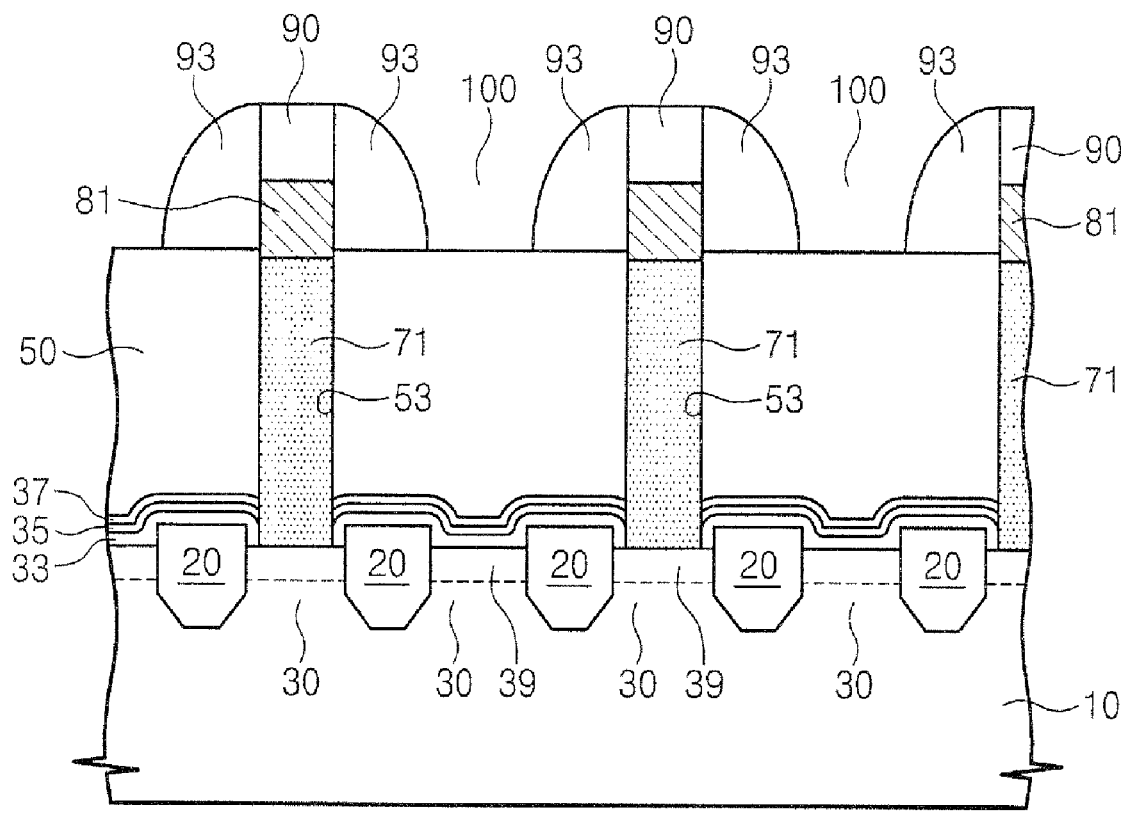
Figure 11:
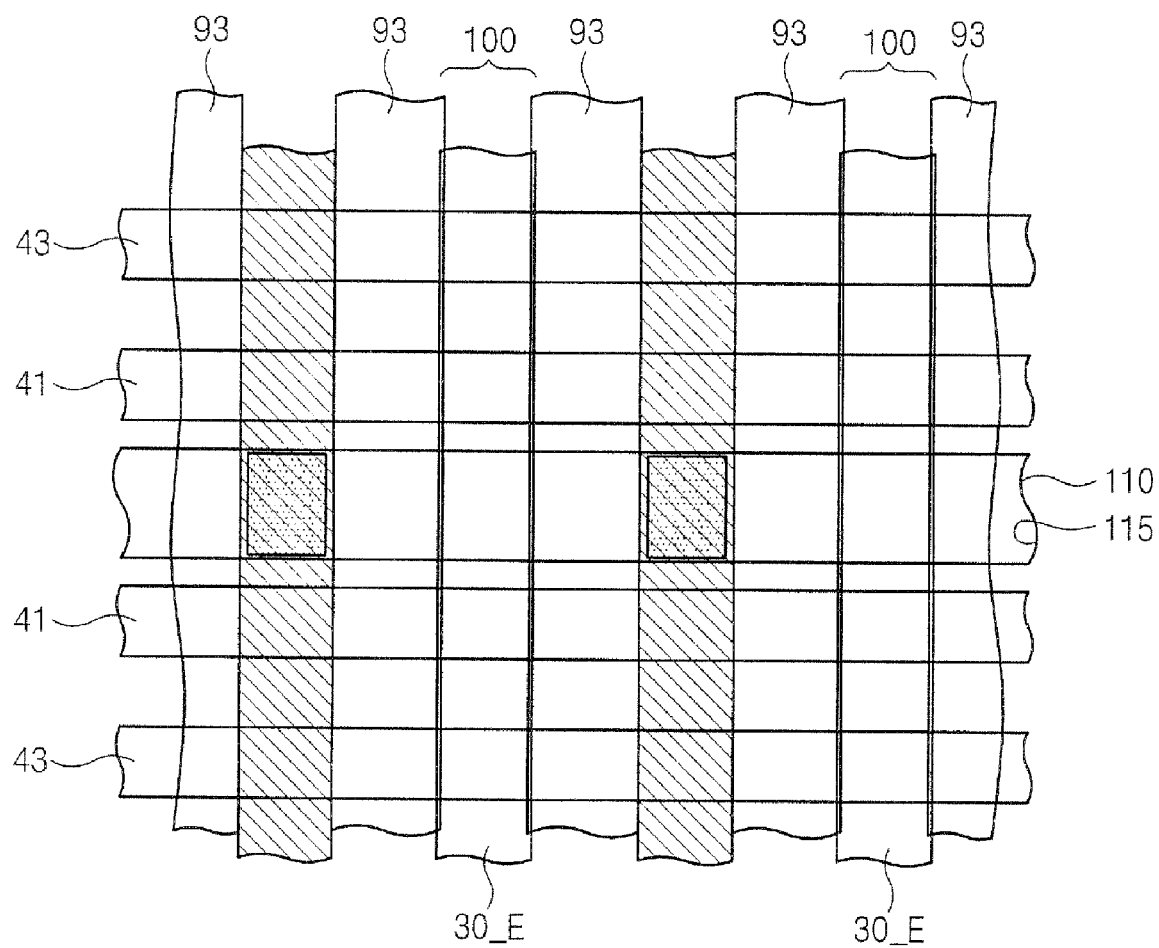

FIGS. 6-14 are views illustrating an exemplary embodiment of a method for forming a non-volatile memory device. Specifically, FIGS. 6, 8-10 and 12-14 are cross-sectional views taken along line I-I' of FIG. 3; and FIGS. 7 and 11 are plan views corresponding to FIGS. 6 and 10, respectively.

Referring to FIGS. 6 and 7, a device isolation region 20 is formed on a substrate 10 to define a plurality of active regions 30. A string select line 41, a ground select line (not shown) and a plurality of word lines 43 between the string and ground select lines are also formed according to well known methods; therefore, a detailed discussion of their formation will be omitted for conciseness. Briefly however, after forming a tunneling insulation layer 33, a memory layer 35, a control insulation layer 37 and a conductive layer (not shown), for word lines and select lines, the conductive layer is patterned to form a string select line 41, word lines 43 and the ground select line (not shown), all of which cross over the active regions 30 and the device isolation regions 20. The conductive layer, the tunneling insulation layer 33, the memory layer 35 and the control insulation layer 37 can be patterned concurrently during a patterning process for the conductive layer. By performing an ion implantation process, the drain region 39 is formed on the active region outside the string select line 41, a source region (not shown) is formed on the active region outside the ground select line, and a source/drain region (not shown) is formed on the active region between the word lines 43.

An insulation layer 50 is formed on the substrate 10 to cover the string select line 41, the ground select line (not shown), and the word lines 43. In one embodiment, the insulation layer 50 may include a material such as an oxide. In another embodiment, the insulation layer 50 may include a multilayer structure of an oxide and a nitride. A first mask 60 having a plurality of first openings 65 defining odd bit line contacts is formed on the insulation layer 50. The first openings 65 of the first mask 60 are disposed over the drain regions formed on odd active regions 30_O outside the string select lines 41. That is, drain regions formed on odd active regions 30_O outside the string select lines 41 are disposed within the first openings 65 of the first mask 60. As exemplarily illustrated, the first openings 65 may overlap with odd active regions 30_O (i.e., odd drain regions).

Figure 8:
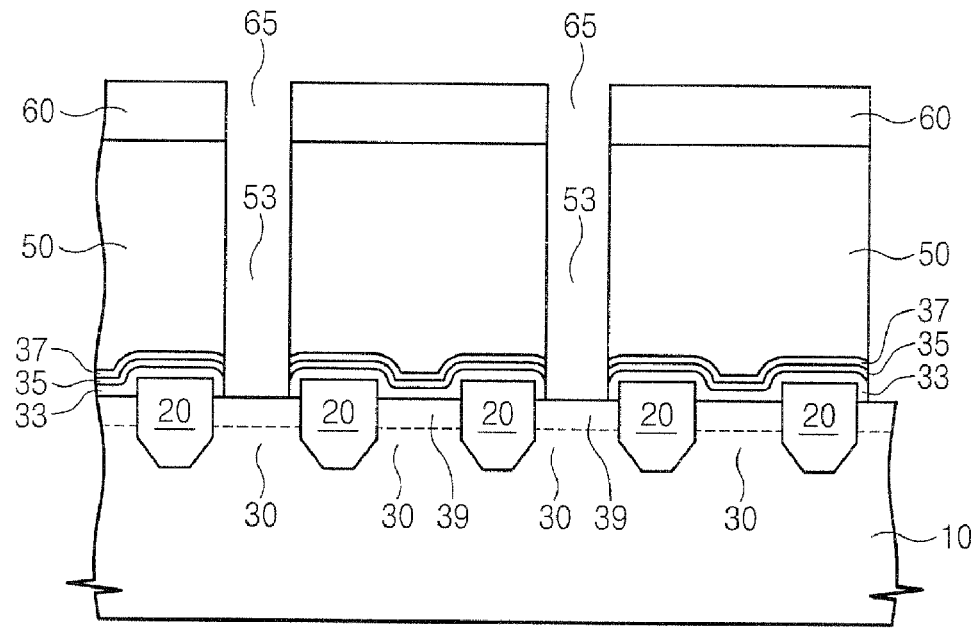

Referring to FIG. 8, the first mask 60 may be used as an etching mask to etch the insulation layer 50, the control insulation layer 37, the memory layer 35 and the tunneling insulation layer 33, thereby forming odd contact holes 53 that expose the drain regions 39 in the odd active regions 30_O.

Referring to FIG. 9, the first mask 60 is removed, odd contacts 71 are formed within the odd contact holes 53 and odd bit lines 81 are electrically connected to respective odd contacts 71. The odd contacts 71 and odd bit lines 81 can be formed according to any of various exemplary methods.

In one exemplary method, odd bit lines 81 can be formed after forming the odd contacts 71. That is, after a material having a good step coverage (e.g., silicon) is formed on the insulation layer 50 to fill the odd contact holes 53, a planarization process (e.g., chemical mechanical polishing (CMP), etch-back or the like) is performed to form the odd contacts 71 in the odd contact holes 53. Next, after forming a conductive material for a bit line on the odd contacts 71 and the insulation layer 50, a patterning process is performed on the conductive material to form odd bit lines 81 that are electrically connected to respective ones of the odd contacts 71. Here, a capping layer 90 including a material such as a nitride can be formed on the odd bit lines 81. The conductive material from which the bit lines 81 are formed may include a material such as a metal, a metal alloy, a silicide, a conductive metal nitride, a conductive metal oxide, silicon, or the like or combinations thereof.

In another exemplary method, the odd contacts 71 and corresponding odd bit lines 81 can be formed concurrently. That is, a conductive material may be formed on the insulation layer 50 to fill the odd contact holes 53, and then a patterning process may be performed to form the odd contacts 71 and the odd bit lines 81. The conductive material may include a material such as a metal, a metal alloy, a silicide, a conductive metal nitride, a conductive metal oxide, silicon, or the like or combinations thereof. In one exemplary embodiment, if a bit line is to be formed as a multilayer structure, a first conductive material (e.g., silicon) may be formed on the insulation layer 50 to fill the odd contact holes 53 and a second conductive material (e.g., a metal having a low electrical resistance) may be formed on the first conductive material. Then, a patterning process can be performed to pattern the second conductive material or the second and first conductive materials.

Referring to FIGS. 10 and 11, spacers 93 are formed on sidewalls of the odd bit lines 81. The spacers 93 may include a material having a suitable etching selectivity with respect to the insulation layer 50. When the insulation layer 50 is formed in a multilayer, the spacers 93 may include a material having an etching selectivity with respect to the uppermost insulation layer of the multilayer insulation layer 50. For example, the spacers 93 may include a nitride (e.g., silicon nitride), an oxide (e.g., aluminum oxide) or a nitride oxide (e.g., silicon oxynitride). Since the spacers 93 are formed on sidewalls of adjacent the odd bit lines 81, adjacent spacers 93 form line-type grooves 100. In one embodiment, these line-type grooves 100 can be used to define where even bit lines are to be subsequently formed. In another embodiment, adjacent ones of the even and odd bit lines can be insulated from each other by a spacer 93 provided therebetween.

Next, and as illustrated in FIG. 11, a second mask 110 is formed to define odd bit line contacts. The second mask 110 includes a second opening 115 that exposes regions where the even bit line contacts are to be subsequently formed. For example, the second opening 115 overlaps at least one drain region 39 formed on the even active region 30_E. In one embodiment, the second opening 115 of the second mask 110 may be disposed between adjacent string select lines 41, and extend in a direction of the string select line 41 to overlap at least two even active regions 30_E and the odd active regions 30_O therebetween. Accordingly, the second opening 115 may be bar- or line-shaped such that the second opening 115 exposes at least two adjacent line-type grooves 100 and exposes the odd bit lines 81 therebetween. The second mask 110 and the spacers 93 formed can be collectively used as an etch mask to form even bit line contacts 76 between string select lines 41. Accordingly, the even bit line contacts 76 can be confined between the spacers 93 and be self-aligned with respect to line-type grooves 100 where even bit lines 86 are to be subsequently formed.

Figure 12:
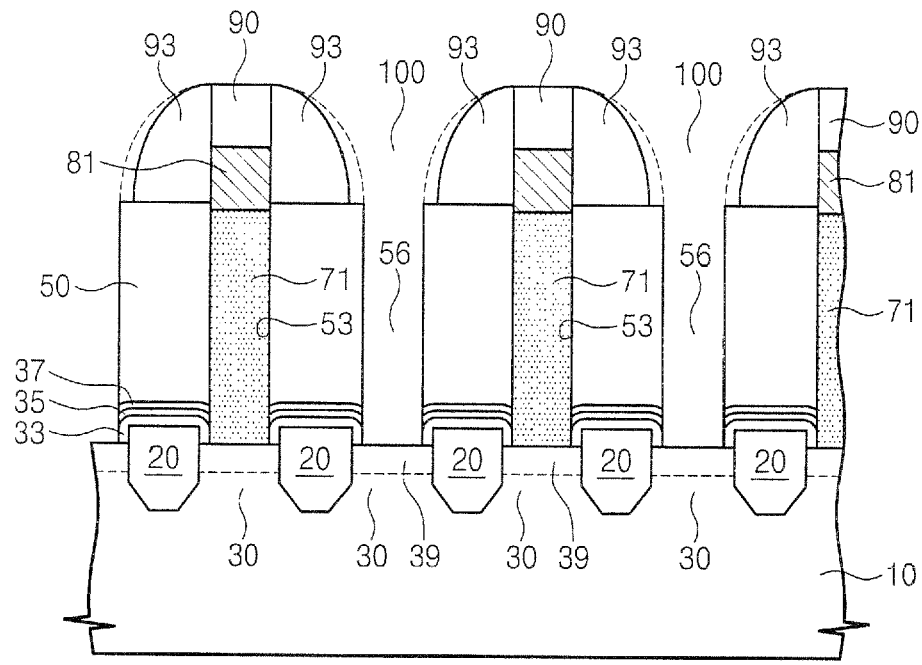

Referring to FIG. 12 by using the second mask 110 and the spacers 93 as an etching mask, the exposed insulation layer 50, the control insulation layer 37, the memory layer 35 and the tunneling insulation layer 33 are etched to form even contact holes 56 between adjacent odd contacts 71. Because the spacer 93 has an etching selectivity with respect to the insulation layer 50, it serves as an etching mask. During the etching process, a portion of the spacers 93 may be etched. In this embodiment, even contact holes 56 may be completely self-aligned with respect to corresponding line-type grooves 100 where even bit lines 86 are to be subsequently formed. Moreover, misalignment between the line-type grooves 100 and even contact holes 56 does not occur. During the etching process, when a portion of a spacer 93 is etched, the width of a subsequently formed even bit line 86 may be greater than the width of the odd bit line 81. On the other hand, the width of the line-type groove 100 can be adjusted by varying the width of the spacers 93. Thus, the width of subsequently formed even bit lines 86 can be appropriately adjusted, as well as the ratio between the widths of the even and odd bit lines 71 and 76, by controlling the width of the spacers 93.

The even contacts 76 and even bit lines 86 can be formed according to any of various exemplary methods. For example, and with reference to FIG. 13, even bit line contacts 76 may be formed by filling the even contact holes 56 and the line-type groove 100 between spacers 93 with a conductive material and subsequently performing an etch-back process. Before performing the etch-back process, a CMP process can be performed. A conductive material for bit lines 86 may then be formed on the even bit line contacts 76 to fill the line-type groove 100 between the spacers 93.

Figure 14:
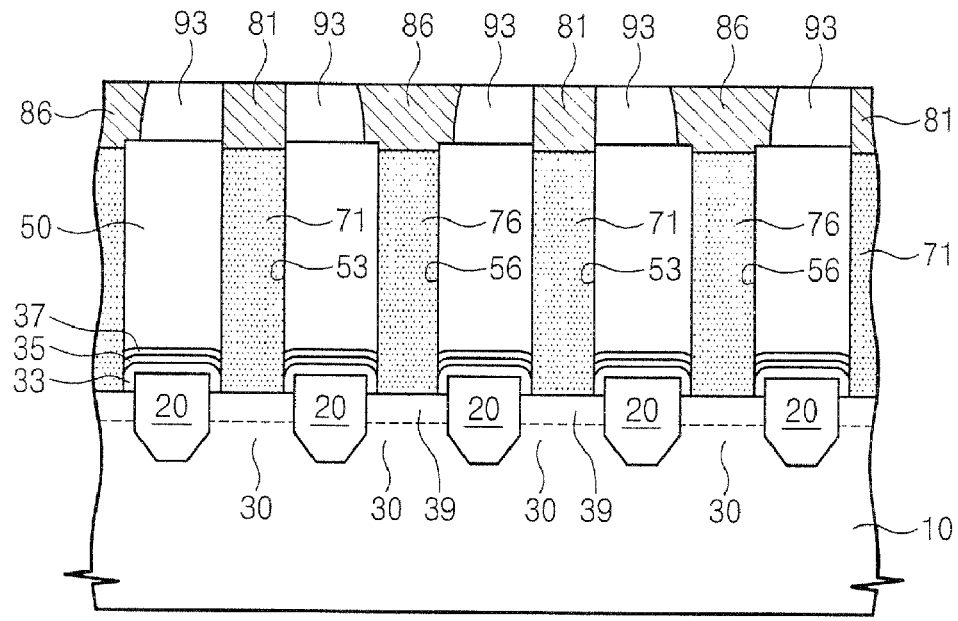

Referring to FIG. 14, even bit lines 86 are formed in a self-aligned manner between spacers 93 and are electrically connected to respective ones of even bit line contacts 76 by etching the conductive material for the bit lines 86. For example, a CMP process may be performed until the top surface of the odd bit lines 81 is exposed, thereby forming the even bit lines 86, The conductive material from which the bit lines 86 are formed may include a material such as a metal, a metal alloy, a silicide, a conductive metal nitride, a conductive metal oxide, silicon, or the like or combinations thereof.

In another exemplary method, the even bit lines and even bit line contacts can be formed concurrently. That is, a conductive material may be formed to fill the even contact holes 56 and the line-type grooves 100 between spacers 93 and a planarization process may then be performed to form the even bit lines 86 and respective even bit line contacts 76.

According to the illustrated embodiment, misalignment between the even bit lines and respective bit line contacts does not occur. Additionally, because even bit lines are formed between the odd bit lines in a self-aligned manner after the odd bit lines are formed, a distance between the adjacent bit lines can be decreased beyond the resolution of a photolithography process (i.e., beyond a design rule). Moreover, an electrical connection between adjacent bit lines can be prevented.

Figure 13:
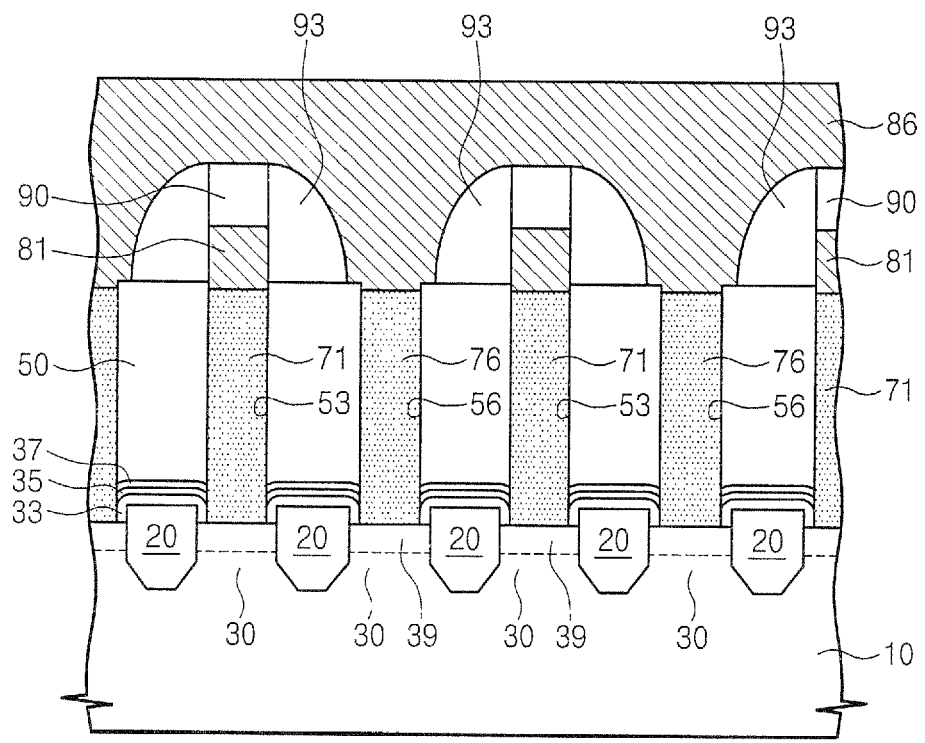
Figure 15:
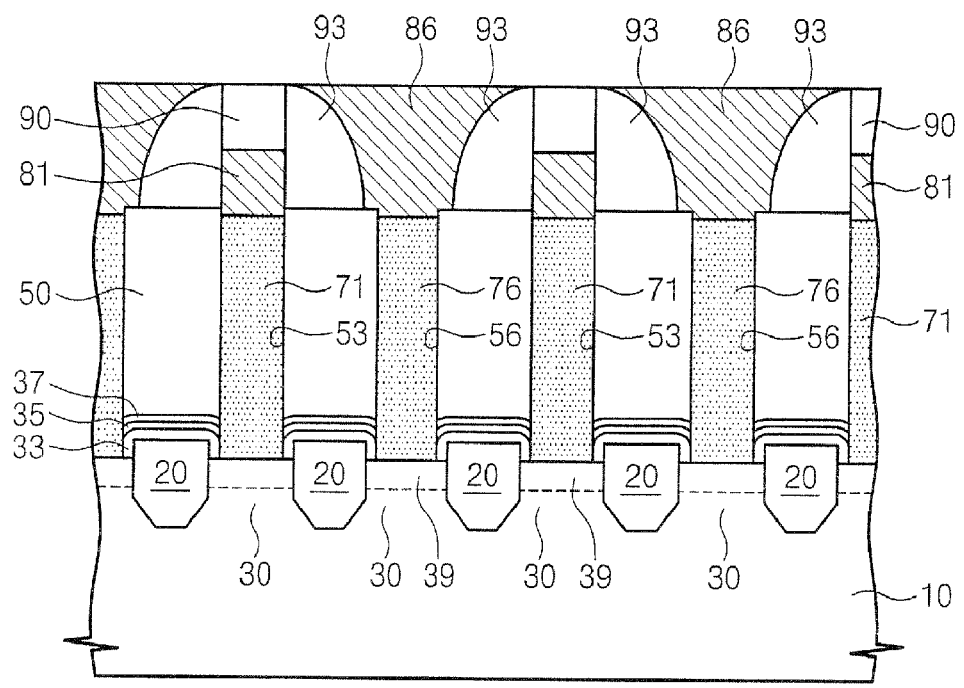
FIG. 15 is a cross-sectional view of another embodiment of a non-volatile memory device.

The conductive material may be subjected to various etches to form the bit lines 86. For example, when an etching amount is adjusted, the even bit lines can be formed in various structures. For example, if a planarization process is performed until the capping layer 90 on the odd bit line is exposed after forming the conductive material for a bit line 86 (e.g., as shown in FIG. 13), then, as exemplarily illustrated in FIG. 15, the top of the even bit lines 86 may be higher than the top of the odd bit lines 81. By further performing an etching process on the conductive material for bit lines 86, the top of the even bit lines 86 may be made lower than the top surface of capping layer 90, or may be lower than or substantially equal to the top of the odd bit lines 81. Moreover, the capping layer 90 can be formed on the even bit line 86.

Although the odd bit lines are formed by performing a patterning process in the above embodiment, they can be formed according to a damascene process. In this case, misalignment between the even bit lines and the even bit line contacts does not occur and misalignment between the odd bit lines and respective odd bit line contacts does not occur. Such a damascene process will be described in greater detail with reference to FIGS. 16-18.

Figure 16:
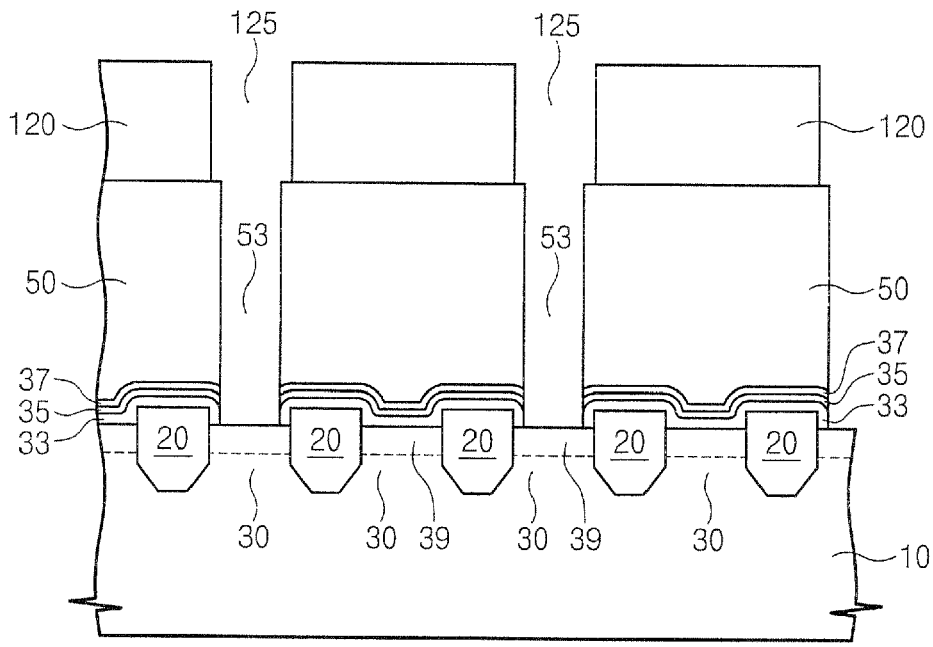
FIGS. 16-18 are cross-sectional views illustrating another exemplary embodiment of a method for forming a non-volatile memory device.

Referring to FIG. 16, a device isolation region 20, an active region 30, a string select line SSL, a word line, and ground select line GSL may be formed on the substrate 10 in the same or similar manner as described above with respect to FIG. 6 and then an insulation layer 50 may be formed. The insulation layer 50 may include a single layer of a material such as oxide or may include multilayer structure of materials such as oxide and nitride. A mold layer 120 may then be formed on the insulation layer 50. The mold layer 120 may include a material having an etching selectivity with respect to the insulation layer 50. For example, when the insulation layer 50 includes an oxide layer, the mold layer 120 may include a material such as a nitride. As shown in FIG. 16, a patterning process is performed on the mold layer 120 to form odd line-type openings 125 and odd contact holes 53. Each odd line-type opening 125 defines an odd bit line while each odd contact hole 53 is self-aligned with the odd line-type opening 125 and defines an odd bit line contact. In the illustrated embodiment, the width of the odd line-type opening 125 may be wider than or substantially equal to the width of the odd contact hole 53.

Figure 17:
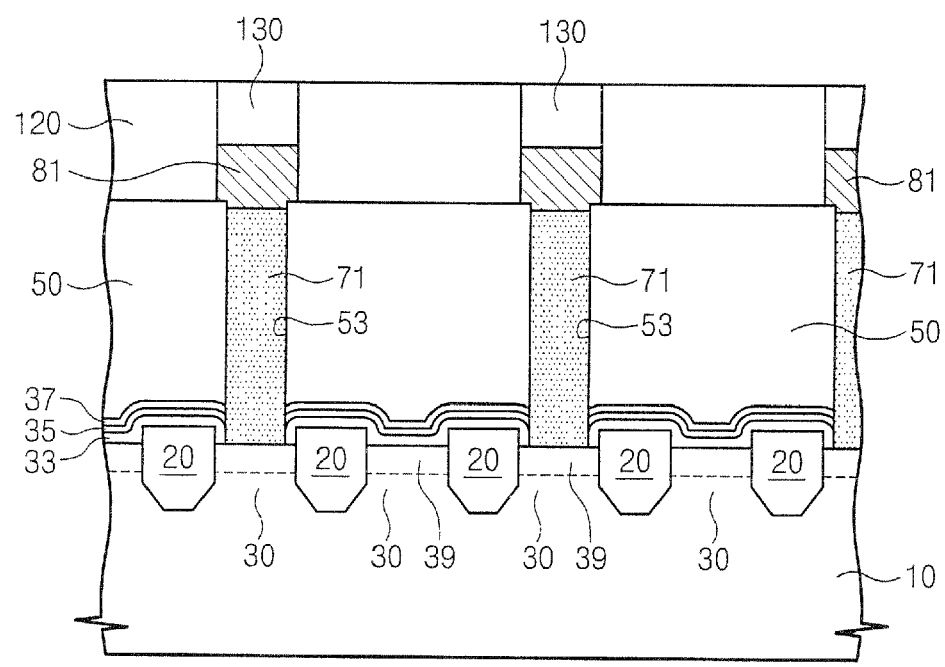

Referring to FIG. 17, odd bit line contacts 71 and odd bit lines 81 are formed by filling each odd contact hole 53 and each odd line-type opening 125 with conductive material. For example, after a conductive material is formed on the mold layer 120 to fill the odd contact holes 53 and the odd line-type openings 125, a planarization process is performed until the mold layer 120 is exposed, thereby forming odd bit lines 81 and odd bit line contacts 71. In one embodiment, the odd bit lines 81 may partially fill the odd line-type openings 125 and an insulation layer including a material such as nitride may be used to fill the remaining portion of the line-type openings 125, thereby forming a capping layer 130. In one embodiment, the top surface of the capping layer 130 may be made lower than the top surface of the mold layer 120 by performing an additional etch-back process on the odd bit line 81. In one embodiment, the capping layer 130 may include an oxide (e.g., aluminum oxide, silicon oxide, etc.).

Figure 18:
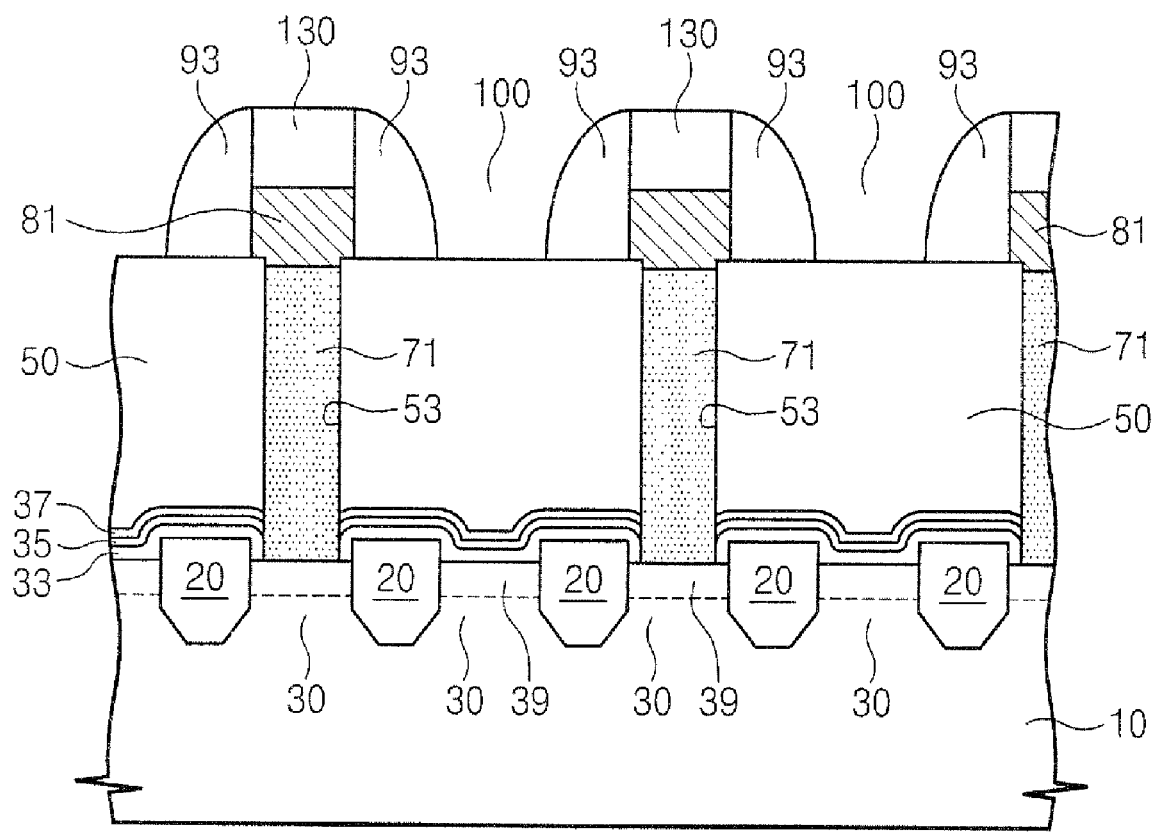

Referring to FIG. 18, after removing the mold layer 120, spacers 93 are formed on sidewalls of the odd bit lines 81 in a similar manner as discussed with respect to FIG. 10. In a similar manner as described with respect to FIG. 11, a second mask having a second opening may be formed to define an even contact hole. Since subsequent processes are identical to those of the previous embodiments, description will be omitted for conciseness.

As described above with respect to FIGS. 16-18, a misalignment between the even bit line and the even bit line contact and between the odd bit line and the odd bit line contact does not occur.

Figure 19:
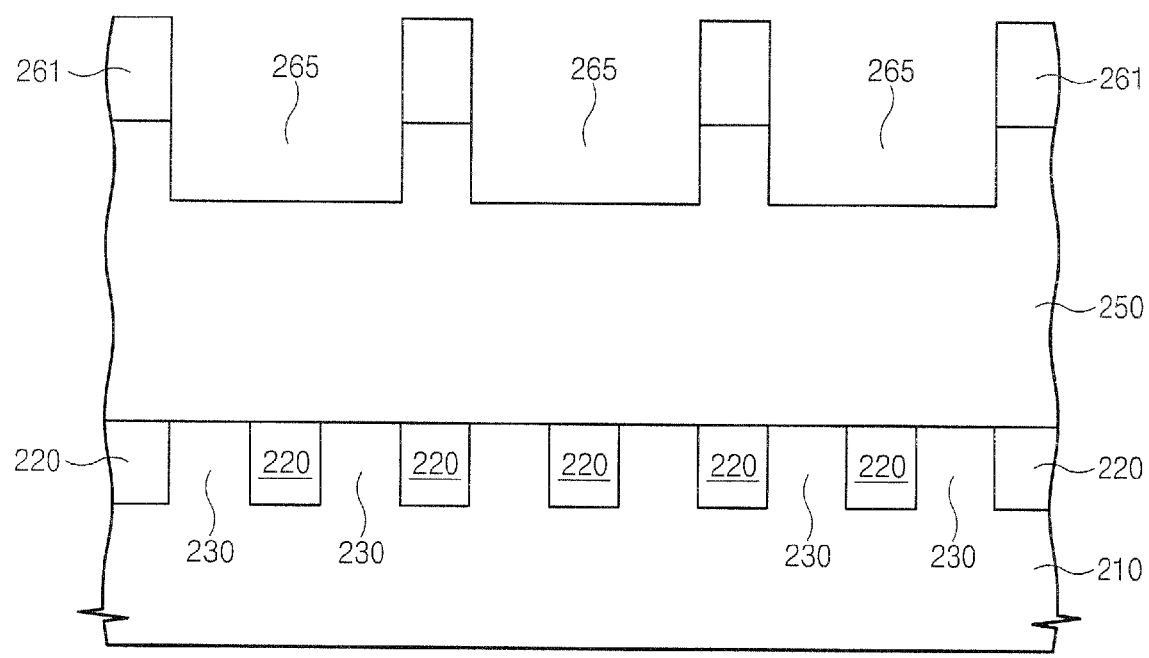
FIGS. 19-26 are cross-sectional views illustrating yet another exemplary embodiment of a method for forming a non-volatile memory device.
Figure 20:
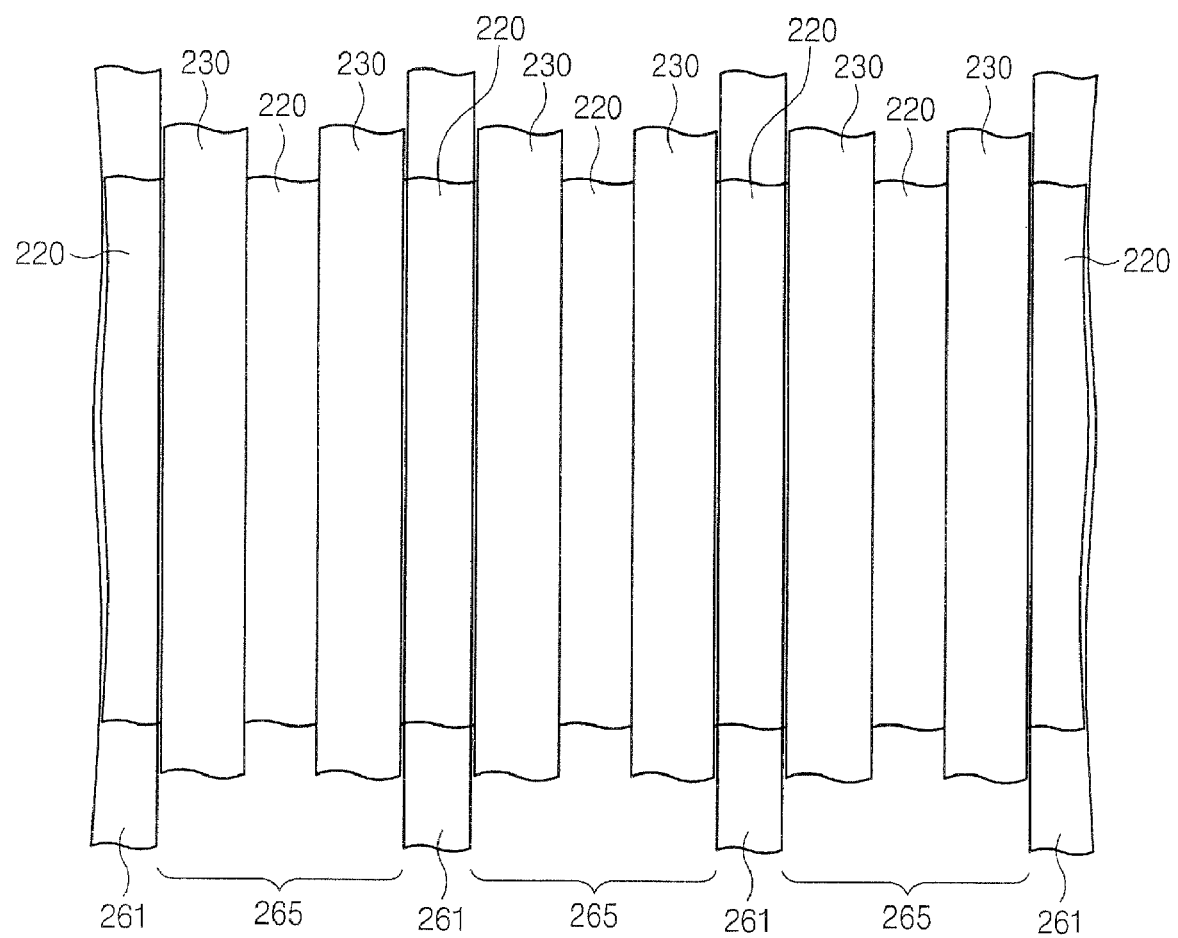
Figure 22:
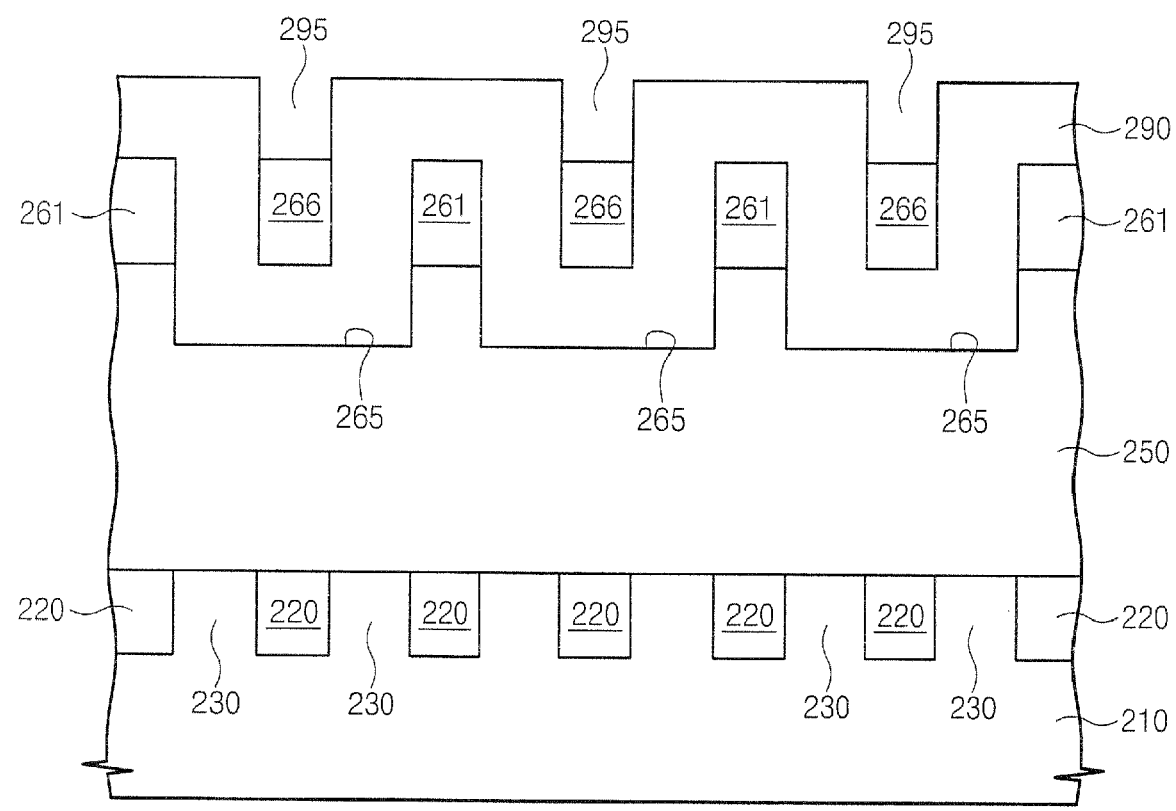
Figure 23:
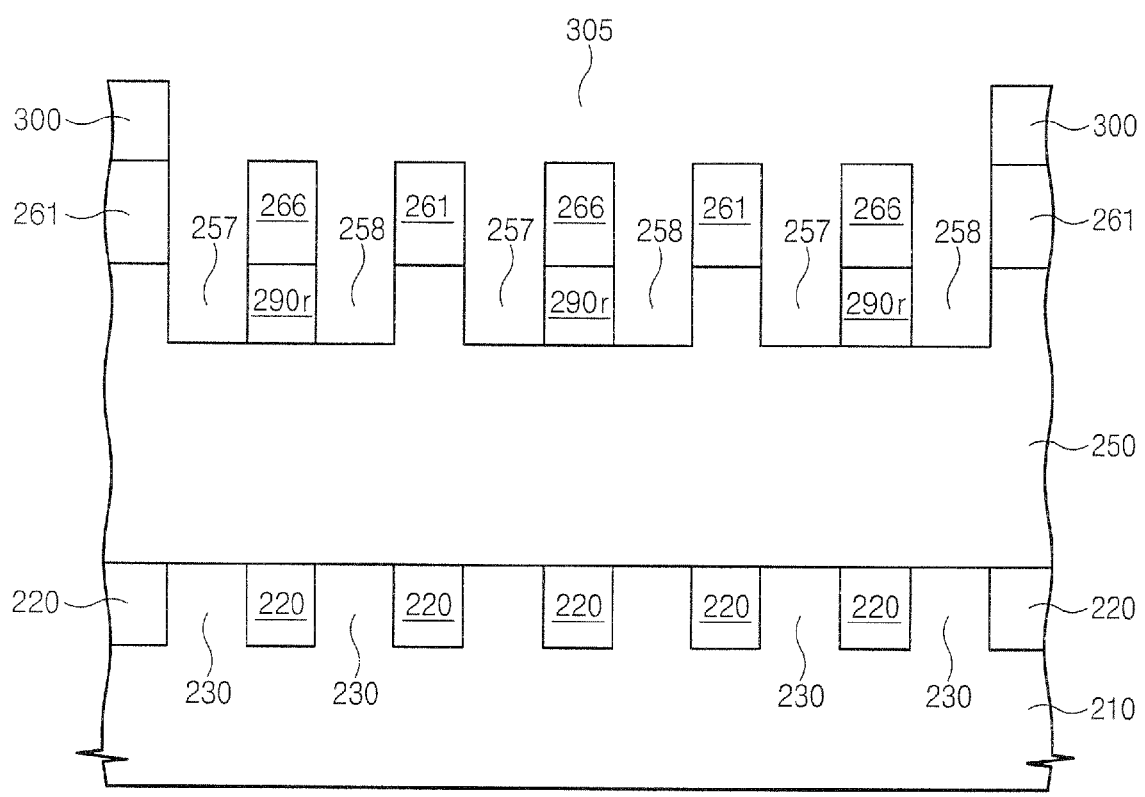
Figure 24:
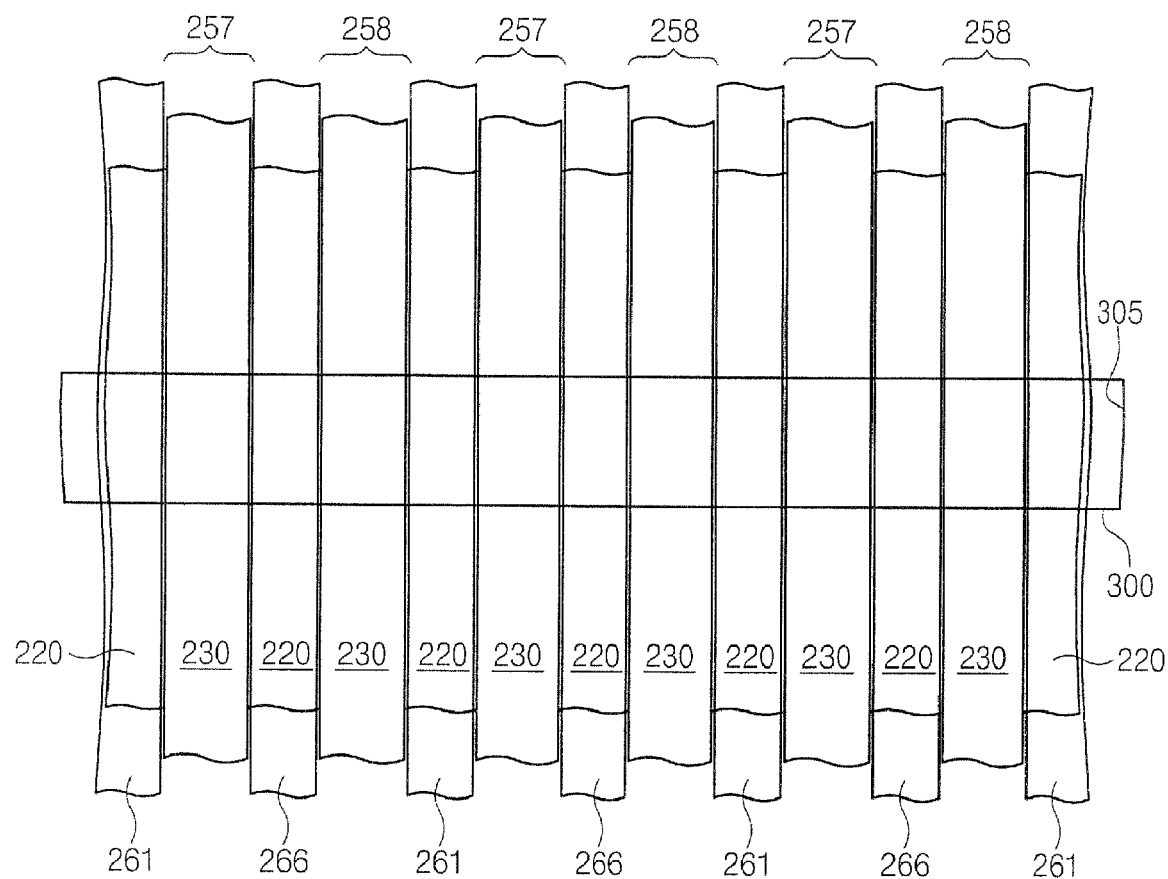

Referring to FIGS. 19-26, a method for forming a bit line according to another embodiment will be described. FIGS. 19, 21-23, 25 and 26 are cross-sectional views taken along a line perpendicular to a bit line direction. FIGS. 20 and 24 are plan views corresponding to FIGS. 19 and 23, respectively.

Referring to FIGS. 19 and 20, a first insulation layer 250 is formed on a substrate 210. The first insulating layer 250 may include a material such as an oxide. The substrate 210 includes a plurality of active regions 230 that are defined by a device isolation region 220. Adjacent active regions 230 are electrically isolated by the device isolation region 220. That is, the active region 230 is defined between the adjacent device isolation regions 220 such that the device isolation region and the active region are alternately disposed on the substrate 210. A first mask pattern 261 is formed to cover odd device isolation regions. The first mask pattern 261 extends in a column direction (e.g., a y-axis direction) to cover the odd device isolation regions. Because the first mask pattern 261 is formed on the first insulation layer 250 to cover the odd device isolation regions, a plurality of first grooves 265 are defined within portions of the first insulation layer 250 exposed by the first mask pattern 261. The first mask pattern 261 may be formed such that each of the first grooves 265 overlaps (or exposes) the even device isolation regions 220 and the active regions 230 on the both sides of the exposed even device isolation regions 220. The first groove 265 extends in the column direction. The first mask pattern 261 includes a material (e.g., a nitride) having an etching selectivity with respect to the first insulation layer 250. For example, after forming a silicon nitride layer on the first insulation layer 250, the first mask pattern 261 may be formed by performing a photolithography process to pattern the silicon nitride layer. At this point, a portion of the first insulation layer 250 between the first mask patterns 261 may be etched.

Figure 21:
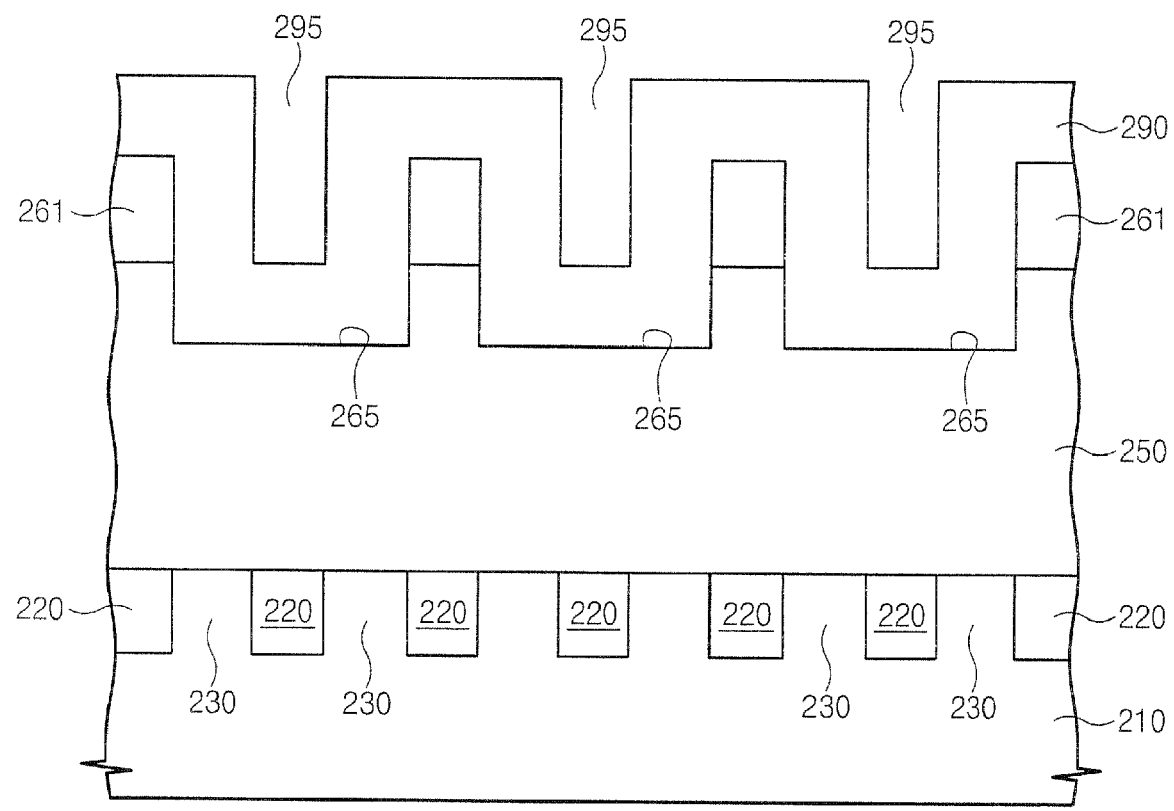

Referring to FIG. 21, a second insulation layer 290 having an etching selectivity with respect to the first mask pattern 261 is formed. For example, the second insulation layer 290 may include an oxide (e.g., silicon oxide). In one embodiment, the second insulation layer 290 may have a substantially uniform thickness and be formed on the side and top surfaces of the first mask pattern 261 and within the plurality of first grooves 265 defined within the first insulation layer 250. Accordingly, the second insulation layer 290 defines a plurality of second grooves 295 overlapping (or exposing) even device isolation regions 220. The second grooves 295 extend in the column direction to overlap (or expose) the even device isolation regions 220.

Referring to FIG. 22, a second mask pattern 266 is formed by filling the second groove 295 with a material (e.g., silicon nitride) having an etching selectivity with respect to the first insulation layer 250 and the second insulation layer 290. For example, after forming a silicon nitride layer on the second insulation layer 290 to fill the second groove 295, the second mask pattern 266 is formed by removing portions of the silicon nitride layer outside the second grooves 295 via an etch-back process. As a result of the etch-back process, the second mask pattern 266 covers the even device isolation regions 220.

Referring to FIG. 23, an etching process is performed on the second insulation layer 290 to remove portions of the second insulation layer 290 on the first mask pattern 261 and portions of the second insulation layer 290 between the first mask pattern 261 and the second mask pattern 266, thereby concurrently forming third grooves 257 and 258. In the illustrated embodiment, the third grooves 257 can be used to define where a subsequently formed odd bit line will be formed and the third grooves 258 can be used to define where a subsequently formed even bit line will be formed.

In the illustrated embodiment, the second mask pattern 266 is formed between adjacent sidewalls of the first mask pattern 261 through a self-aligned method using the second insulation layer 290. Thus, the third grooves 257 and 258 are defined between the first mask pattern 261 and the neighboring second mask pattern 266 in a self-aligned method.

Referring now to FIGS. 23 and 24, a third mask 300 is formed to have an opening 305 defining a bit line contact hole. The opening 305 of the third mask 300 may be bar- or line-shaped and extend in a row direction (e.g., in an x-axis direction) to define a plurality of bit line contact holes concurrently. For example, the opening 305 of the third mask 300 concurrently exposes the third grooves 257 and the third grooves 258 to define where even bit line contact holes and odd bit line contact holes will be concurrently formed.

Figure 25:
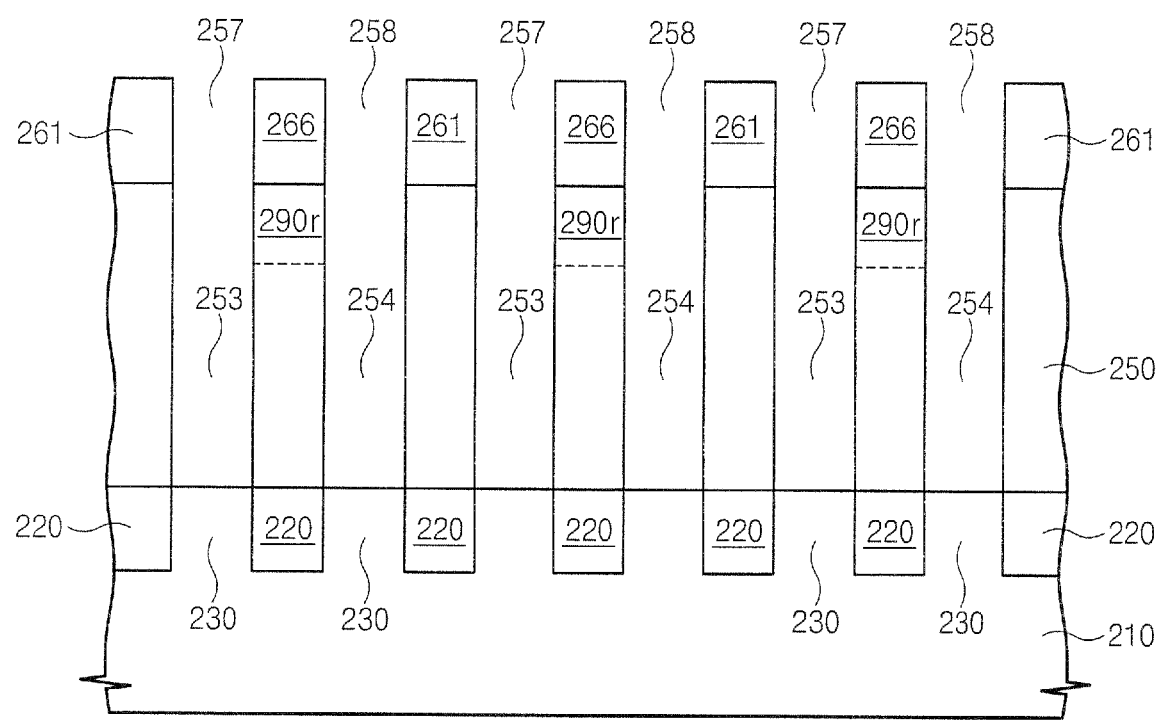

Referring to FIG. 25, using the third mask 300, the second mask pattern 266 and the first mask pattern 261 as an etching mask, the first insulation layer 250 is patterned to form odd bit line contact holes 253, self-aligned with respect to the third grooves 257, and even bit line contact holes 254, self-aligned with respect to the third grooves 258. The third mask 300 is then removed.

Figure 26:
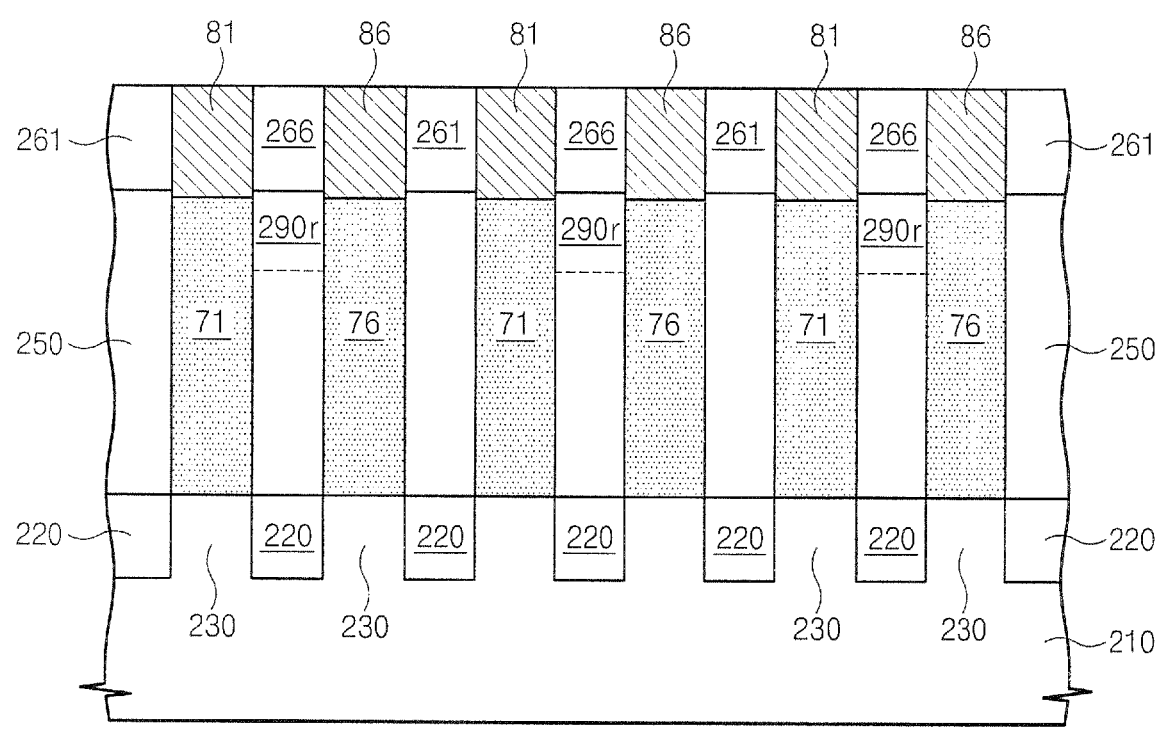

Referring to FIG. 26, a conductive material for a bit line contact and a bit line is then provided to fill the contact holes 253 and 254 and the third grooves 257 and 258. A planarization process is performed on the conductive material until the first mask pattern 261 and the second mask pattern 266 are exposed, thereby forming bit lines 81 and 86 and bit line contacts 71 and 81. In the illustrated embodiment, even bit lines and odd bit lines are formed concurrently. Moreover, misalignment between the even bit lines and corresponding even bit line contacts does not occur and misalignment between the odd bit lines and corresponding odd bit line contacts does not occur. According to this embodiment, the even bit lines and the odd bit lines may have the substantially the same structure. For example, the heights and widths of the even and odd bit lines may be substantially the same and the top surfaces of the even and odd bit lines may be substantially coplanar.

Referring to FIGS. 19-26, a remaining portion 290r of the second insulation layer may remain below the second mask pattern 266. That is, although the first insulation layer 250 is disposed between an even device isolation region and the first mask pattern 261, the remaining portion 290r may remain between the odd device isolation region and the second mask pattern 266.

The bit line contacts 71 and 81 and the bit lines 81 and 86, formed according to the process exemplarily described above with respect to FIGS. 19-26, can be formed in a manner similar to the processes exemplarily described above with respect to FIGS. 6-15.

Figure 27:
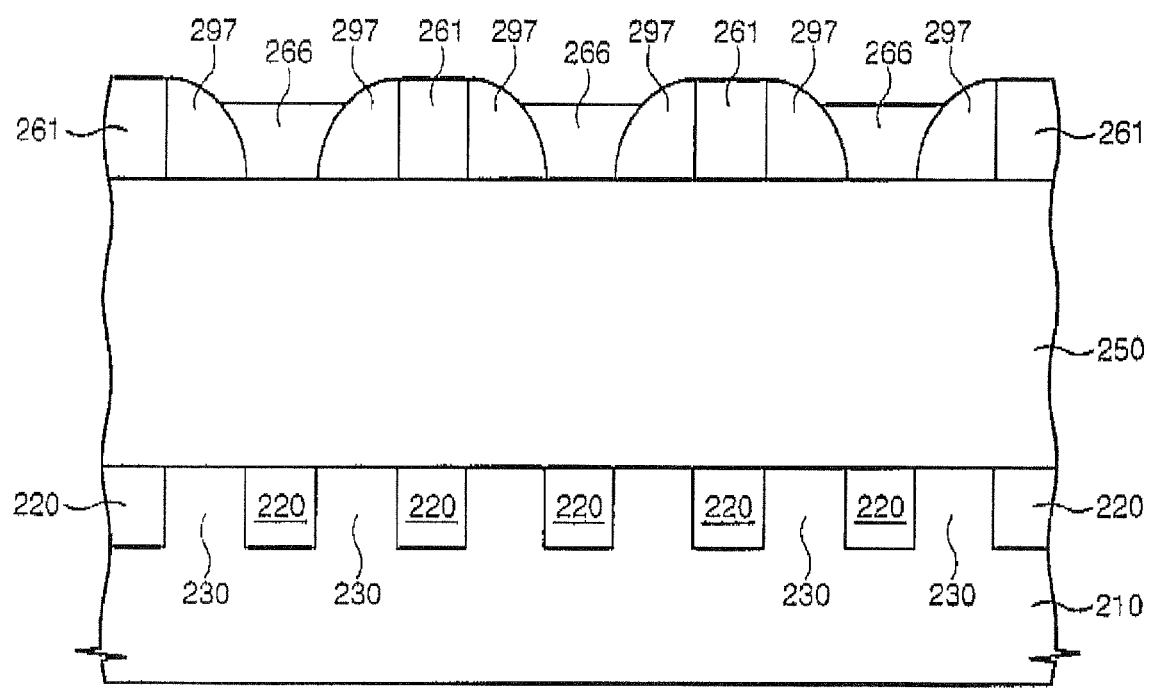
FIG. 27 is a cross-sectional view illustrating still another exemplary embodiment of a method for forming a non-volatile memory device.

Referring to FIG. 27, the second insulation layer 290 can, in another embodiment, be formed on the sidewall of the first mask pattern 261 (e.g., within grooves of the first mask pattern 261) as a spacer 297 instead of being formed by filling the first groove 265 as shown in FIG. 21. In such an embodiment, the aforementioned first grooves 265 are not defined within the first insulation layer 250 and, after forming the second insulation layer 290, an etch-back process is performed to form spacers 297 on sidewalls of the first mask pattern 261. Due to the formation of spacers 297, the second mask pattern 266 directly contacts the first insulation layer 250. The process for forming the bit line contacts and bit lines may then proceed as described with respect to FIG. 23.

In the embodiment of FIGS. 19 through 26, after the third mask 300 is formed, portions of the second insulation layer 290 between the first mask pattern and the second mask pattern can be removed to define the third grooves 257 and 258. That is, after forming the odd and even bit line contact holes, the second insulation layer 290 between the adjacent first mask and second mask is removed to form the third grooves 257 and 258 for an odd and even bit line.

FIGS. 19-26 illustrate processes to form a conductive line on a cell region. According to another embodiment exemplarily illustrated in FIGS. 28-35, a conductive line can also be formed on a peripheral circuit region of the substrate, concurrently with the formation of the bit lines over the cell region.

Figure 28:
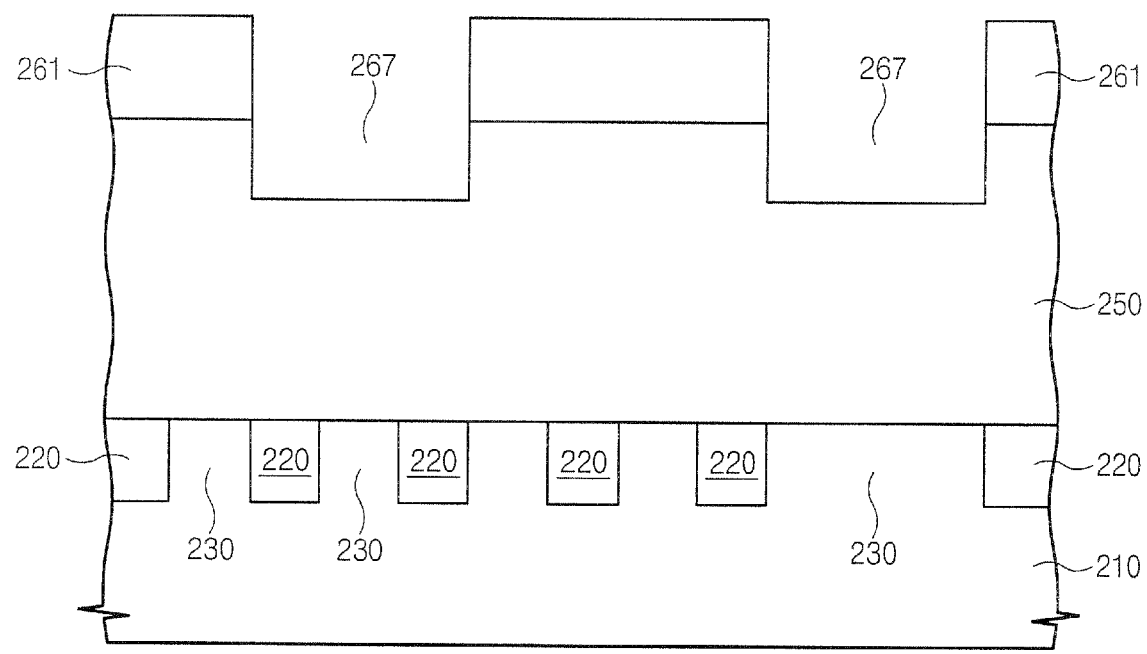
FIGS. 28-35 are cross-sectional views illustrating yet another exemplary embodiment of a method for forming a non-volatile memory device.

Referring to FIG. 28, the aforementioned first mask pattern 261 may be formed over a cell region and over a peripheral circuit region concurrently with the process described with respect to FIGS. 19 and 20. In the illustrated embodiment, the first mask pattern may further include fourth grooves 267 where conductive lines are to be formed.

Figure 29:
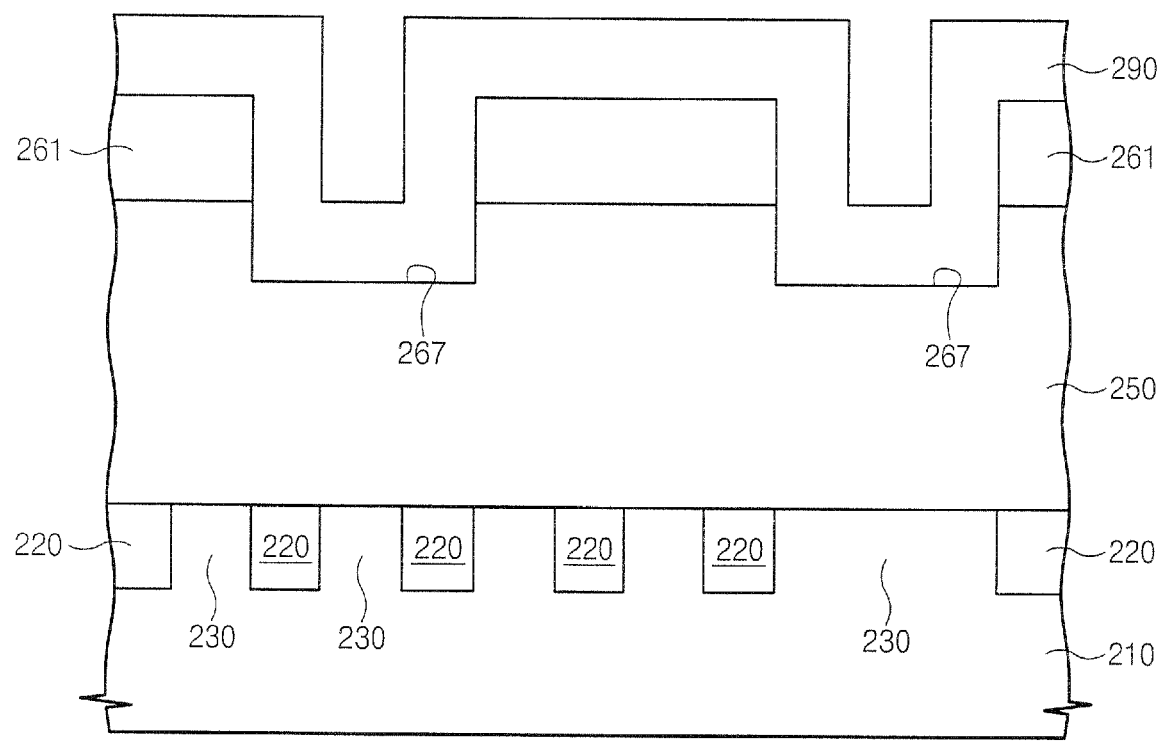
Figure 30:
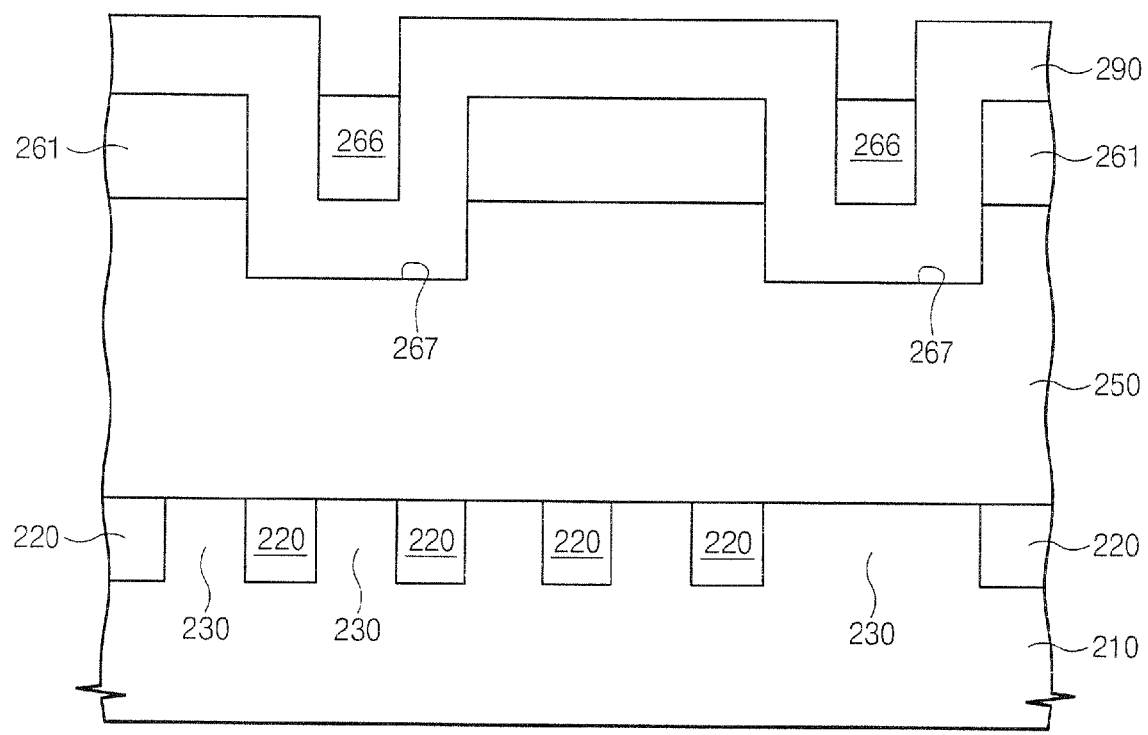

Referring to FIGS. 29 and 30, the aforementioned second insulation layer 290 and second mask 266 may be formed over the cell region and the peripheral circuit region concurrently with the process described with respect to FIGS. 21 and 22.

Figure 31:
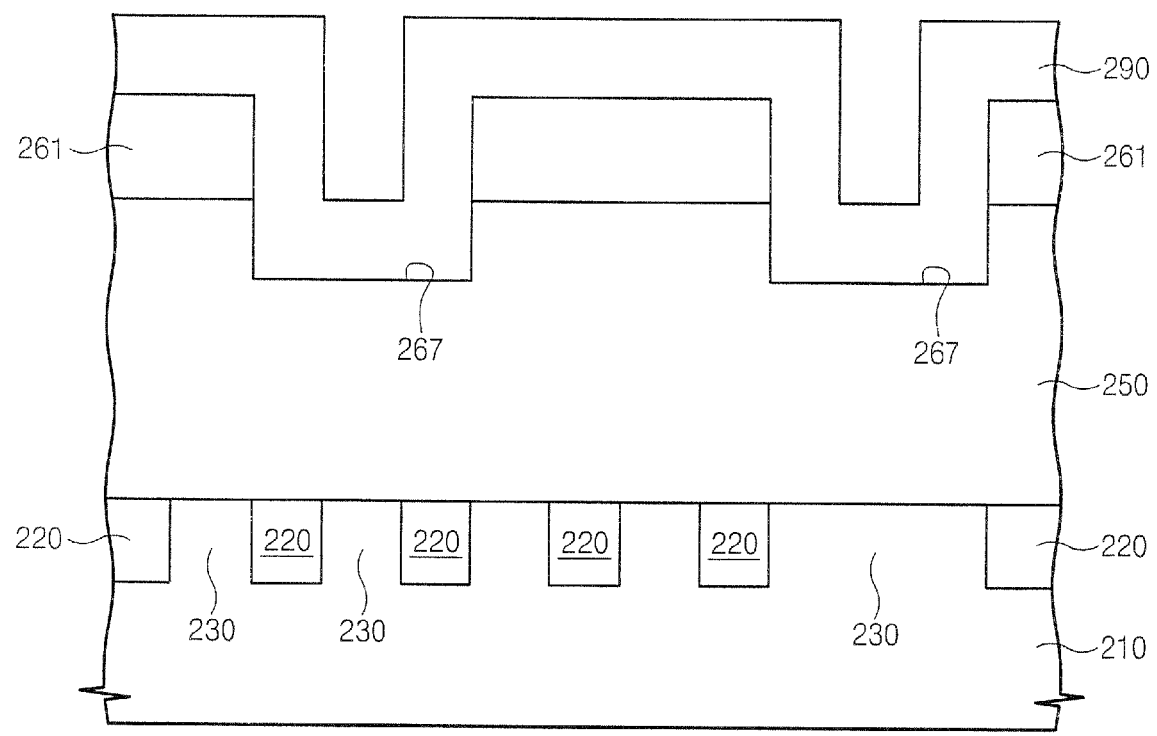
Figure 32:
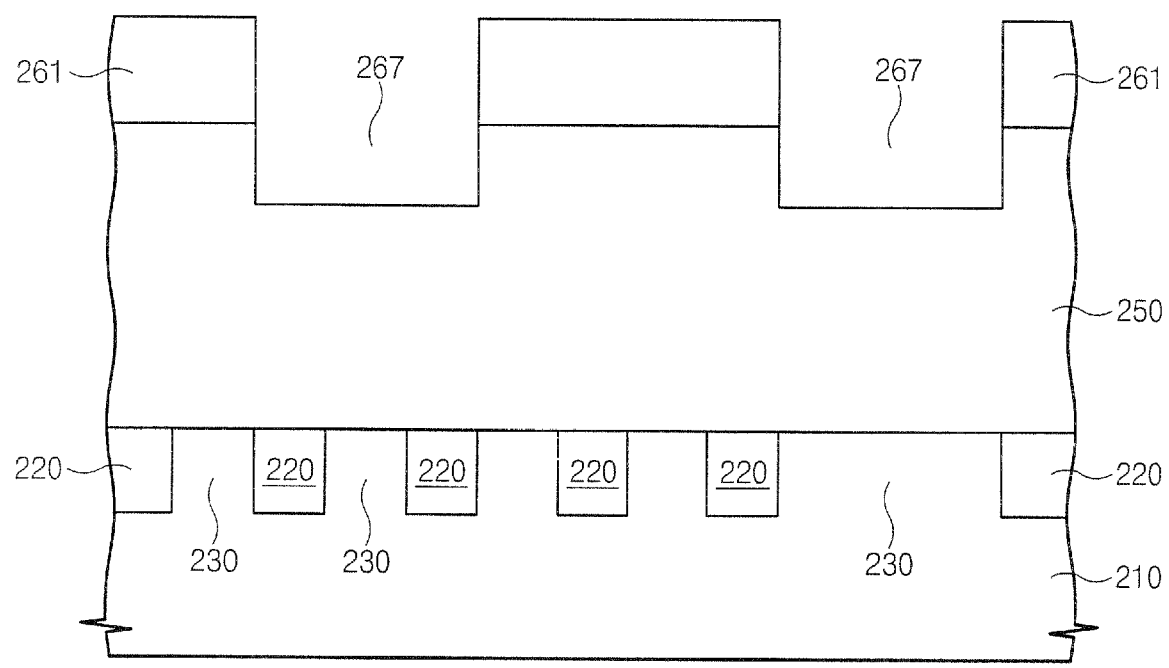

Referring to FIGS. 31-32, after forming the second mask pattern 266 and before forming the aforementioned third mask 300, an etch process is performed to remove the portion of second mask pattern 266 and second insulation layer 290 within the fourth groove 267 over the peripheral circuit region while retaining the fourth groove 267 defined by the first mask pattern 261 in the peripheral circuit region. For example, after forming the second mask pattern 266 and the second insulation layer 290 on the cell and peripheral circuit regions, a protective mask (not shown) may be formed to cover the cell region. Then, the second mask pattern 266 is removed in a peripheral circuit region where is not covered by the protective mask.

Referring again to FIG. 32, when removing the second insulation layer 290 on and between the first mask pattern 261 and the second mask pattern 266 over the cell region, the portion of the second insulation layer 290 within the fourth groove 267 over the peripheral region is also removed also (e.g., in the manner as described with respect to the embodiment shown in FIG. 23), to expose the fourth groove 267.

In another embodiment, the second mask pattern and the second insulation layer can be selectively formed only on the cell region instead of forming second mask pattern and second insulation layer on the cell and peripheral regions and then selectively removing portions of the second mask pattern and the second insulation layer over the peripheral circuit region. In such an embodiment, a process for removing the second insulation layer and the second mask layer over the peripheral circuit region will be omitted.

Figure 33:
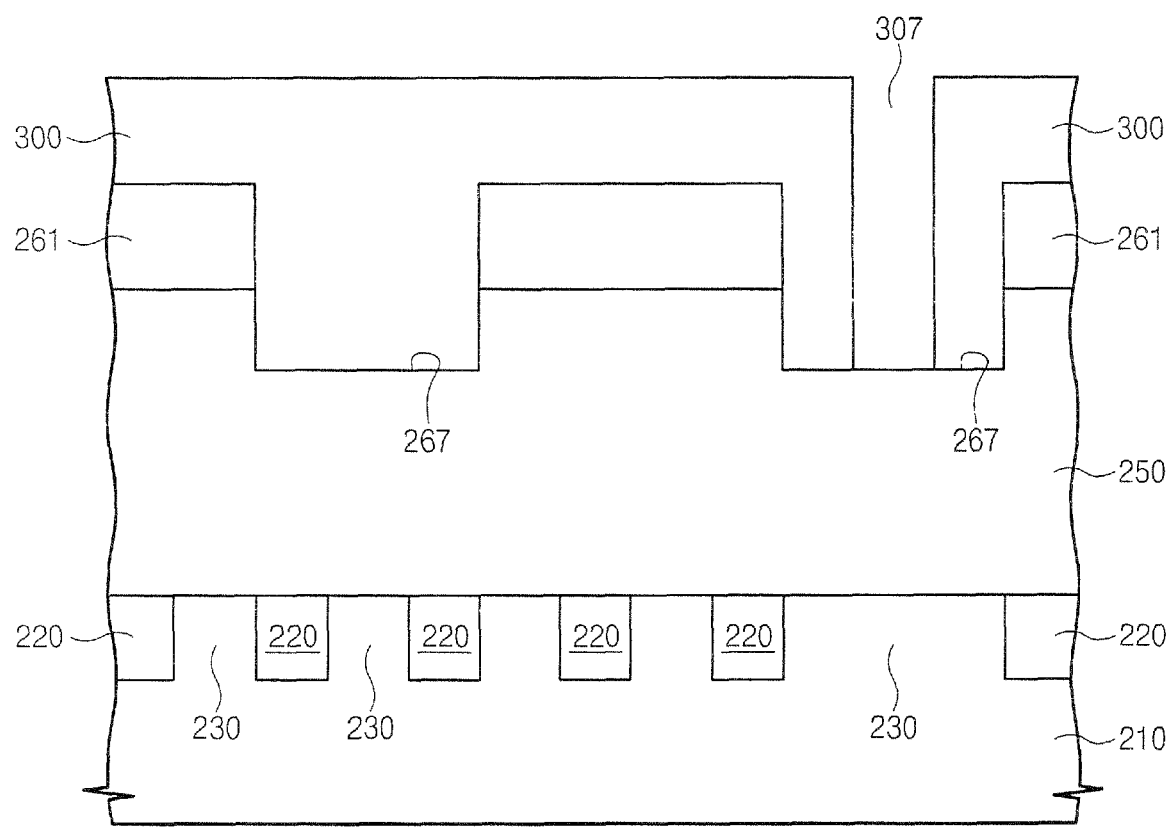

Referring to FIG. 33, when forming the aforementioned third mask 300 having the third opening 305 as described with respect to FIGS. 23 and 24, the third mask 300 may also be formed on the first mask 261 and the first insulation layer 250 in the cell and peripheral circuit regions and further include an opening 307 exposing the fourth groove 267 over the peripheral circuit region.

Figure 34:
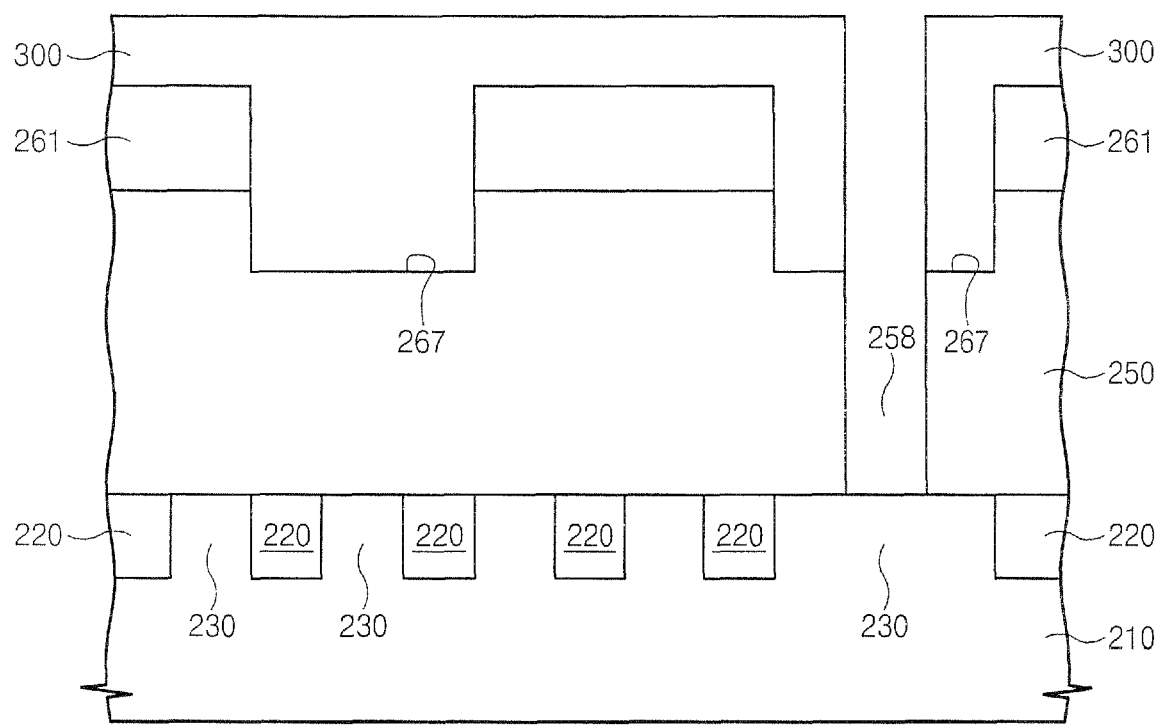

Referring to FIG. 34, when forming the aforementioned contact holes as described above with respect to FIG. 25, the first insulation layer 250 may be patterned to form a contact hole 258. As shown, the contact hole 258 is self-aligned with respect to the fourth groove 267.

Figure 35:
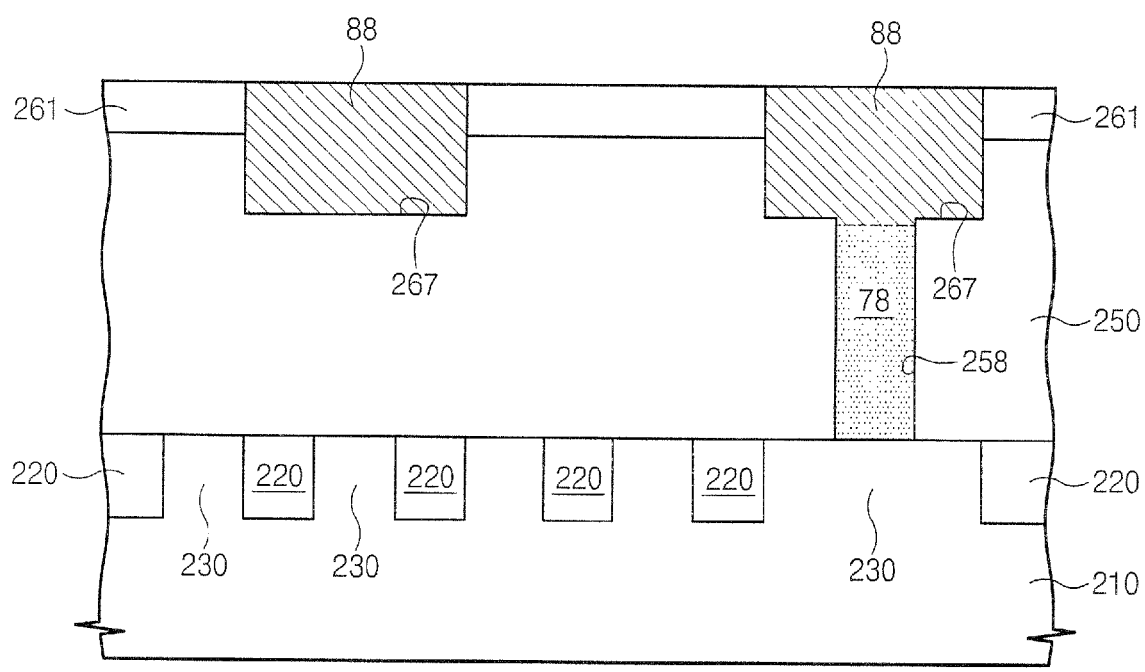

Referring to FIG. 35, when the aforementioned conductive material is planarized by, for example, etching to form bit lines and bit line contacts as shown in FIG. 26, a conductive line 88 and a contact 78 for a conductive line may be similarly formed in the peripheral circuit region.

The method for forming bit lines in the above embodiments can be applied to various fields. For example, the methods can be applied to form a conductive line that is electrically connected to corresponding conductive region below the conductive line through a contact plug. Additionally, the methods can be applied to form a cross-point memory device having a memory layer defined at a cross-point of top and bottom electrodes (i.e., at a region where the top and bottom electrodes cross each other). Thus, when the top electrode and the bottom electrode are connected through a contact plug in the cross-point memory device, the methods exemplarily described in the above embodiments can be applied.

A method for forming a semiconductor device and/or a method for forming a non-volatile memory device according to the embodiments of the present invention can be applied to a stacked memory device or a three dimensional memory device. In one embodiment, the stacked memory device may include stacked substrates. At least one substrate of the plurality of stacked substrates may include a memory device or a memory chip, and at least one memory device may include a non-volatile memory device fabricated according to the embodiments exemplarily described above.

Figure 36:
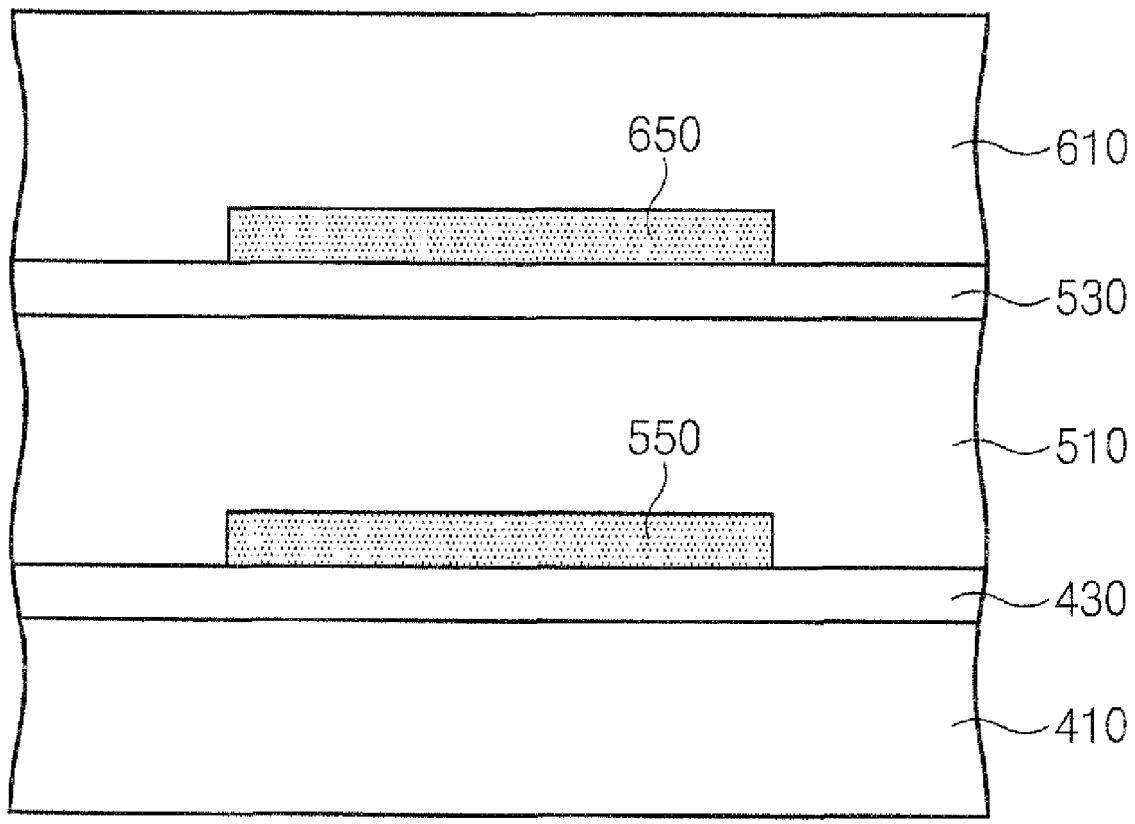
FIG. 36 is a cross-sectional view of an exemplary embodiment of a stacked memory device including a non-volatile memory device.

FIG. 36 is a cross-sectional view of one embodiment of a stacked memory device including a non-volatile memory device.

Referring to FIG. 36, the stacked memory device may, for example, include a first level substrate 410, a second level substrate 510, and a third level substrate 610. The second level substrate 510 and the third level substrate 510 include memory devices 550 and 650. Substrates can be insulated from each other via insulation layers 430 and 530. However, the memory devices 550 and 650 on each substrate may be or may not be electrically connected to each other.

The memory device in the substrates may be configured the same or differently. For example, the memory device 550 in the second level substrate 510 may be a flash memory device and the memory device 650 in the third level substrate 610 may be a volatile memory device, or vice versa. Additionally, the memory device in a specific level substrate may include different types of memory devices. For example, the memory device 550 of the second level substrate 510 may include a volatile memory device, a ferroelectrics memory, a resistance memory, a phase-change memory, a magnetic memory or combinations thereof in addition to a non-volatile memory device. The memory device may be a memory capable of storing one bit or more than two bits of a multi bit.

Figure 37:
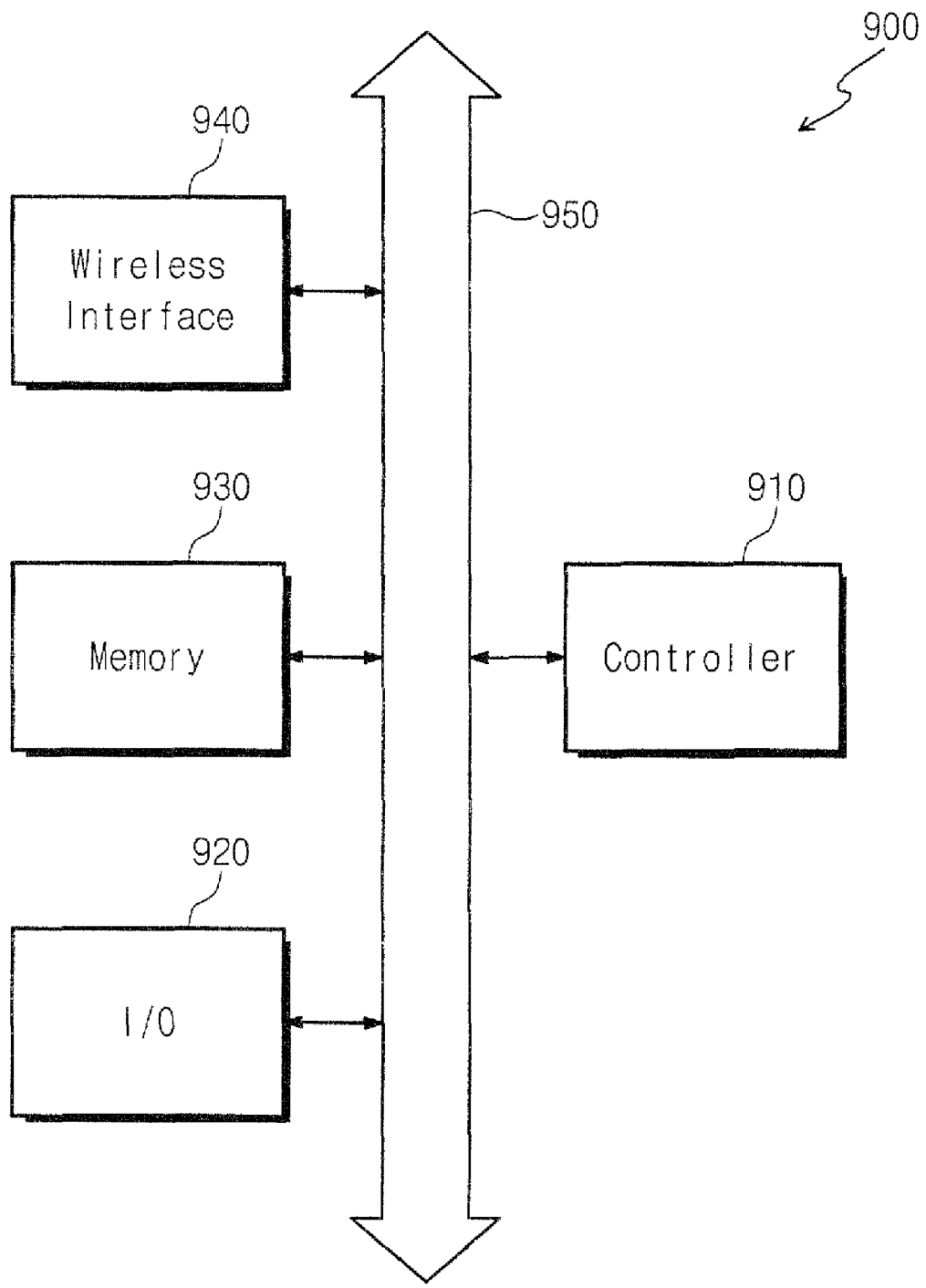
FIG. 37 is a block diagram of an exemplary embodiment of a system including a non-volatile memory device.

FIG. 37 is a block diagram of a system 900 including a non-volatile memory device according to an embodiment of the present invention. The system 900 can be used in a wireless communication device such as a PDA, a laptop computer, a portable computer, a web tablet, a wireless phone, a mobile phone, a digital music player, or all devices transmitting and/or receiving information via a wireless environment.

The system 900 may include a controller 910, an input/output device 920 such as a keypad, a keyboard and a display, a memory 930, and a wireless interface 940 combined each other through a bus 950. The controller 910 may include more than one microprocessor, a digital signal processor, a microcontroller, or any devices similar to those. The memory 930 can be used to store commands executed by the controller 930. The memory 930 includes a flash memory according to the embodiments of the present invention. The memory 930 includes another type of a memory, a volatile memory where arbitrary access is possible, or various types of memory.

The system 900 may use a wireless interface 940 transmitting data into a wireless communication network or receiving data from the network. For example, the wireless interface 940 includes an antenna and a wireless transceiver.

The system 900 can be used in a communication interface protocol of a third generation communication system such as CDMA, GSM, NADC, E-TDMA, WCDAM, and CDMA2000.

Figure 38:
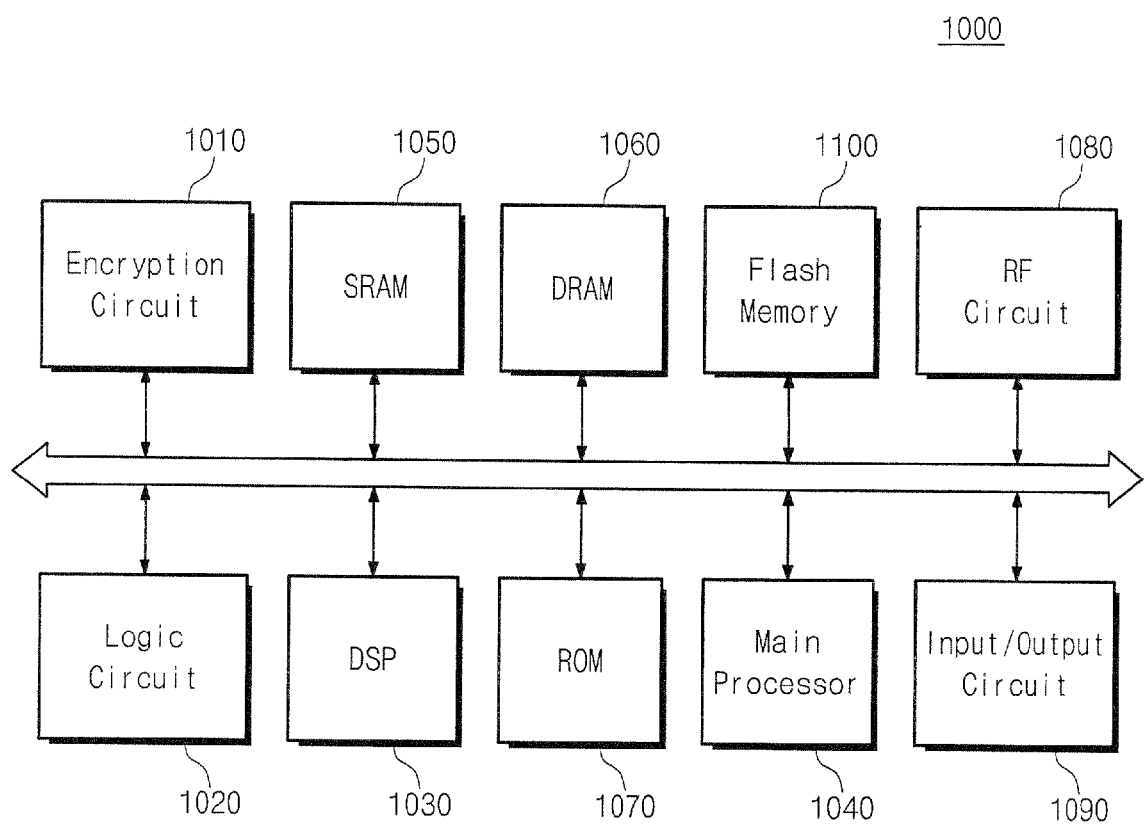
FIG. 38 is a block diagram of an exemplary embodiment of a memory card incorporating a non-volatile memory device.

The semiconductor device and/or the non-volatile memory exemplarily device described herein can be applied to a memory card. FIG. 38 is a block diagram of a memory card 1000 applied with a non-volatile memory device 1100 according to an exemplary embodiment.

Referring to FIG. 38, the memory card 1000 may include an encryption circuit for encoding, a logic circuit 1020, a digital signal processor (DSP), and a main processor 1040. Additionally, the memory card system 1000 includes a flash memory device 1100 and other various kinds of memories such as SRAM 1050, DRAM 1060, and ROM 1070. The memory card system 1000 includes RF (high frequency/microwave) circuit 1080 and an input/output circuit 1090. Function blocks 1010 in the memory card 1000 are connected to each other through a system bus.

The memory card 1000 operates according to a control of the external host (not shown), and the non-volatile memory device 1100 stores data or output the stored data according to a control of the host.

According to the embodiments exemplarily described above, misalignment between the bit line and the bit line contact can be prevented.

According to the embodiments exemplarily described above, a more highly integrated memory device can be obtained.

Accordingly, one embodiment can be exemplarily characterized as a method for forming a conductive line that includes forming an insulation layer on a substrate, the substrate including a plurality of first regions and a plurality of second regions, each of the second regions being disposed between adjacent first regions. A plurality of first lines are formed on the insulation layer, the first lines being electrically connected to respective first regions through respective first contacts penetrating the insulation layer. Spacers are formed on a side of the first lines. A plurality of contact holes are formed between the adjacent first contacts by removing the insulation layer between the adjacent spacers, the contact holes exposing respective second regions. A plurality of second contacts are formed to fill the corresponding contact holes and a plurality of second lines are formed to be electrically connected to respective second contacts.

Other embodiments can be exemplarily characterized as a method of forming a non-volatile memory device may include forming a string select line, a ground select line, and a plurality of word lines between the string select line and the ground select line on a substrate having a plurality of active regions, the string and ground select lines and the plurality of word lines crossing over the active regions. An insulation layer is formed to cover the ground select line, the string select line, and the plurality of word lines. The insulation layer is patterned to form a plurality of first contact holes. A plurality of first contacts are formed to fill respective first contact holes and a plurality of first bit lines are formed to be electrically connected to respective first contacts. A spacer is formed on a side of each of the first bit lines. A second contact hole is formed between the adjacent first contact holes by removing the insulation layer between the adjacent spacers. A second contact is formed to fill the second contact holes and a second bit line is formed to be electrically connected to the second contact.

Still other embodiments can be exemplarily characterized as a semiconductor device including a plurality of first bit lines and a plurality of first contacts connected to respective first bit lines. A spacer is provided on a side of each of the first bit lines. A second bit line is self-alignedly disposed between the adjacent spacers. A second contact is self-aligned and connected to the second bit line.

Still, other embodiments can be exemplarily characterized as a non-volatile memory device including a substrate including a plurality of active regions defined by a device isolation region. A string select line, a ground select line, and a plurality of word lines between the string select line and the ground select line are provided to cross over the active regions. An insulation layer covers the string select line, the ground select line, the plurality of word liens, and the active regions. A first contact penetrates the insulation layer to electrically connect to odd active regions, and a bit line is electrically connected to respective first contacts. A spacer is provided on a side of each of the first bit lines. A second bit line is provided self-alignedly between the adjacent spacers. A second contact is self-aligned and connected to the second bit line.

Yet other embodiment can be exemplarily characterized as a method of forming a semiconductor device that includes forming a first insulation layer on a substrate. A plurality of spaced apart first masks are formed on the first insulation layer. A plurality of first grooves are defined between adjacent first masks. A second insulation layer is formed on a side of each of the first masks to define a plurality of second grooves, the second groove having a smaller width than the first grooves. A plurality of second masks are formed to fill respective second grooves. A plurality of second masks are formed to fill respective second grooves. A plurality of third grooves for a bit line are formed by removing the second insulation layer, each of the third grooves being disposed between adjacent first and second masks. A third mask is formed, the third mask having an opening exposing the third groove. A plurality of contact holes are formed between the adjacent first and second masks and self-aligned with respective third grooves by patterning the first insulation layer using the third mask, the second mask, and the first mask as an etching mask. A conductive material is formed on the first masks and the second mask to fill the third groove and respective contact hole. A plurality of conductive lines and a plurality of contacts are formed by performing an etching process on the conductive material, the contacts being self-aligned with respective lines.

A further embodiment can be exemplarily characterized as a method of forming a conductive line that includes forming a first insulation layer on a substrate. A plurality of spaced first masks are formed on the first insulation layer. A plurality of second masks are formed to divide a first groove defined between the adjacent first masks, each of the second masks being disposed between the adjacent first masks. A third mask is formed, the third mask having opening crossing over at least one of a plurality of third grooves, the third groove being defined by the adjacent first mask and the second mask. A contact hole self-aligned with respective third groove is formed by patterning the first insulation layer using the third mask, the second mask, and the first mask as an etching mask. A plurality of conductive lines and a plurality of contacts self-aligned with respective conductive lines are formed by filling the contact holes and the third grooves with a conductive material and etching the filled conductive material.

Some embodiments can be exemplarily characterized as a stacked memory device including a plurality of substrates. A memory device is disposed on the at least one substrate. The memory device may include the non-volatile memory device formed by exemplary embodiments.

Other embodiments can be exemplarily characterized as a memory card including a microprocessor and a memory device coupled to the microprocessor. The memory device may include the non-volatile memory device formed by exemplary embodiments.

The above-disclosed subject matter is to be considered as illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for forming a semiconductor device, the method comprising:
    forming an insulation layer on a substrate, the substrate including a plurality of first regions and a plurality of second regions, at least one of the second region being disposed between adjacent first regions;
    forming a plurality of first conductive lines on the insulation layer, the first conductive lines being electrically connected to respective first regions through respective first contacts through the insulation layer;
    forming a plurality of spacers on sidewalls of the plurality of first conductive lines;
    forming a plurality of contact holes between the adjacent first contacts by removing portions of the insulation layer between the adjacent ones of the plurality of spacers, the contact holes exposing respective second regions; and
    forming a plurality of second contacts filling respective contact holes and forming a plurality of second conductive lines electrically connected to respective second contacts.

2. The method of claim 1, wherein forming the plurality of contact holes comprises:
    forming a mask having an opening, the opening overlapping at least one of the second regions; and
    etching the insulation layer using the mask and the plurality of spacers as an etching mask.

3. The method of claim 2, wherein the opening extends over the first conductive lines and overlaps the plurality of second regions.

4. The method of claim 1, wherein forming the plurality of second contacts and forming of the plurality of second conductive lines comprises:
    forming a conductive material filling the plurality of contact holes and a space between the spacers; and
    etching the conductive material such that the conductive material is insulated from the first conductive lines.

5. A method of forming a non-volatile memory device, the method comprising:
    forming a string select line, a ground select line, and a plurality of word lines between the string select line and the ground select line on a substrate having a plurality of active regions, the string and ground select lines and the plurality of word lines crossing over the active regions;
    forming an insulation layer covering the ground select line, the string select line, and the plurality of word lines;
    patterning the insulation layer to form a plurality of first contact holes;
    forming a plurality of first contacts within respective first contact holes and forming a plurality of first bit lines electrically connected to respective first contacts;
    forming a plurality of spacers on sidewalls of the first bit lines;
    forming a second contact hole between adjacent ones of the plurality of first contact holes by removing the insulation layer between the adjacent ones of the plurality of spacers; and
    forming a second contact within the second contact holes and a second bit line electrically connected to the second contact.

6. The method of claim 5, wherein forming the second contact hole comprises:
    forming a mask overlapping the active region between adjacent first contacts; and
    etching the insulation layer using the mask and the plurality of spacers as an etching mask.

7. The method of claim 6, wherein an opening of the mask overlaps at least one of the first contacts and overlaps active regions at both sides of the first contact.

8. The method of claim 6, wherein forming the second contact and forming the second bit line comprises:
    forming a first conductive material within the second contact hole and within a space between adjacent ones of the plurality of spacers;
    etching the first conductive material such that a top surface of the first conductive material is lower than a top surface of the first bit line;
    forming a second conductive material between the adjacent ones of the plurality of spacers; and etching the second conductive material such that the second conductive material is insulated from the first bit line, wherein the second bit line is electrically connected to the second contact.

9. The method of claim 6, wherein forming the plurality of first contacts and forming the plurality of first bit lines comprises:
   forming a first conductive material on the insulation layer and within the plurality of first contact holes;
   etching the first conductive material;
   forming a second conductive material on the first etched first conductive material and on the insulation layer; and
   patterning the second conductive material.

10. A method of forming a semiconductor device, the method comprising:
    forming a first insulation layer on a substrate;
    forming a first mask on the first insulation layer, the first mask defining an opening;
    forming a first groove within the first insulation layer using the first mask;
    forming a second insulation layer on the first mask and on a side of the first groove to define a second groove, the second groove having a smaller width than the first groove;
    forming a second mask at least partially filling the second groove;
    forming a plurality of third grooves for bit lines by removing portions of the second insulation layer, each third groove being between the first and second masks;
    forming a third mask having an opening exposing the plurality of third grooves;
    forming a plurality of contact holes disposed between the adjacent first and second masks and self-aligned with the third grooves by patterning the first insulating layer using the third, second and first masks as an etching mask;
    forming a conductive material on the first and second masks to fill the third grooves and respective contact holes; and
    forming a plurality of conductive lines and a plurality of contacts by performing an etching process on the conductive material, the contacts being self-aligned with respective conductive lines.

11. The method of claim 10, further comprising, before the forming the first insulation layer:
    defining a plurality of active regions on the substrate using a device isolation region; and
    forming a string select line, a ground select line, and a plurality of word lines disposed between the string select line and the ground select line, the string and ground select lines and the plurality of word lines crossing over the active regions,
    wherein each of the conductive lines is a bit line electrically connected to a respective active region outside the string select line.

12. The method of claim 11, wherein the first mask is aligned over an odd device isolation region and the second mask is aligned over an even device isolation region.

13. A method of forming a semiconductor device, the method comprising:
    forming a first insulation layer on a substrate;
    forming a first mask on the first insulation layer, the first mask defining a first groove therein;
    forming a second mask dividing the first groove, the second mask disposed within the first groove and defining a plurality of third grooves between the first and second masks;
    forming a third mask, the third mask having an opening crossing over at least one of the plurality of third grooves;
    forming a plurality of contact holes self-aligned with respective third grooves by patterning the first insulation layer using the third mask, the second mask, and the first mask as an etching mask; and
    forming a plurality of conductive lines and a plurality of contacts self-aligned with respect to corresponding conductive lines by filling the contact holes and the third grooves with a conductive material and etching the conductive material.

14. The method of claim 13, wherein forming the second mask comprises:
    forming a second insulation layer on sidewalls of the first mask to define a second groove having a smaller width than the first groove;
    forming the second mask within the second groove; and
    defining the third grooves by removing the second insulation layer between the first mask and the second mask.

* * * * *